(12) United States Patent
Cao et al.

(10) Patent No.: US 8,173,477 B2
(45) Date of Patent: May 8, 2012

(54) ISOLATION CHAMBER AND METHOD OF USING THE ISOLATION CHAMBER TO MAKE SOLAR CELL MATERIAL

(75) Inventors: Xinmin Cao, Sylvania, OH (US); Bradley S. Mohring, Delta, OH (US)

(73) Assignee: Xunlight Corporation, Toledo, OH (US)

( * ) Notice: Subject to any disclaimer, the term of this patent is extended or adjusted under 35 U.S.C. 154(b) by 0 days.

(21) Appl. No.: 12/931,432

(22) Filed: Feb. 1, 2011

(65) Prior Publication Data

US 2011/0189806 A1  Aug. 4, 2011

Related U.S. Application Data

(60) Provisional application No. 61/337,485, filed on Feb. 3, 2010.

(51) Int. Cl.
*H01L 31/18* (2006.01)

(52) U.S. Cl. ............. 438/61; 438/57; 438/62; 118/718; 118/719; 136/256; 136/257; 136/258

(58) Field of Classification Search ................. 438/57, 438/609, 758, 61–62; 118/712, 723, 718–719, 118/620; 136/256–258
See application file for complete search history.

(56) References Cited

U.S. PATENT DOCUMENTS

2011/0104848 A1* 5/2011 Haas et al. ................. 438/57

* cited by examiner

*Primary Examiner* — Dung A. Le
(74) *Attorney, Agent, or Firm* — Emch, Schaffer, Schaub & Porcello, Co., L.P.A.

(57) ABSTRACT

Apparatuses and methods are provided for the continuous formation of solar cell material including an isolation chamber that reduces cross contamination between adjacent formation zones that are at different pressures.

20 Claims, 15 Drawing Sheets

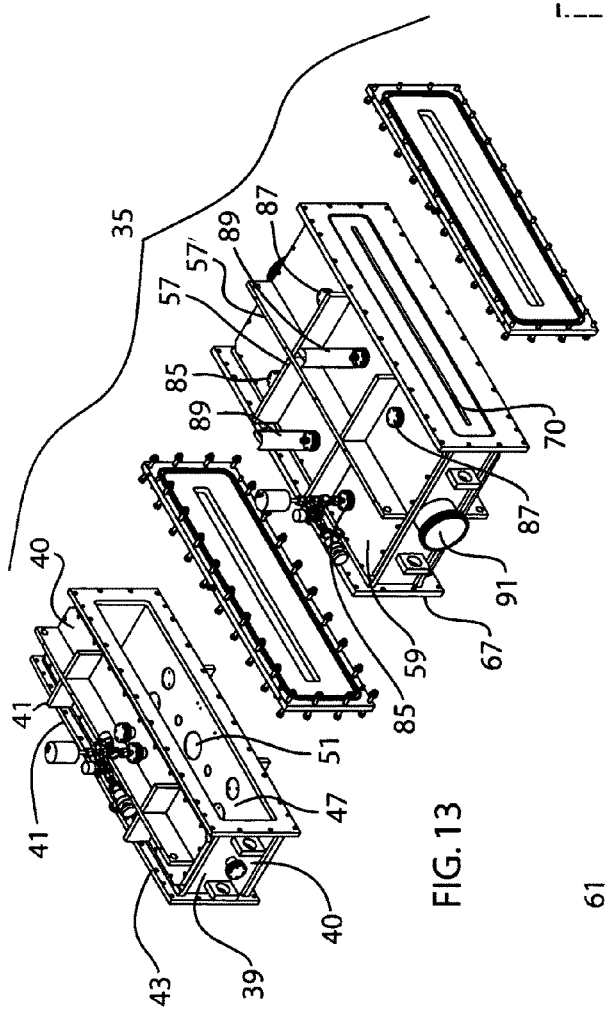
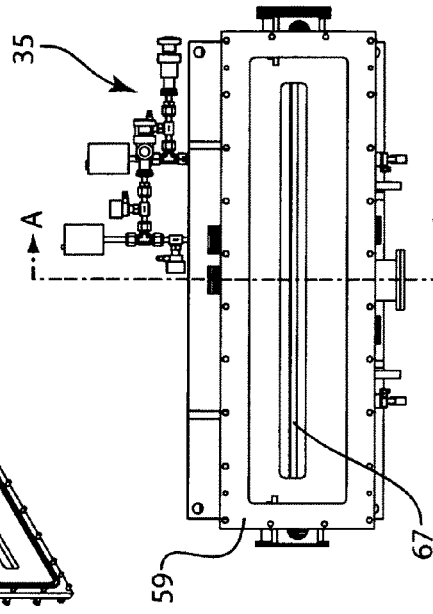
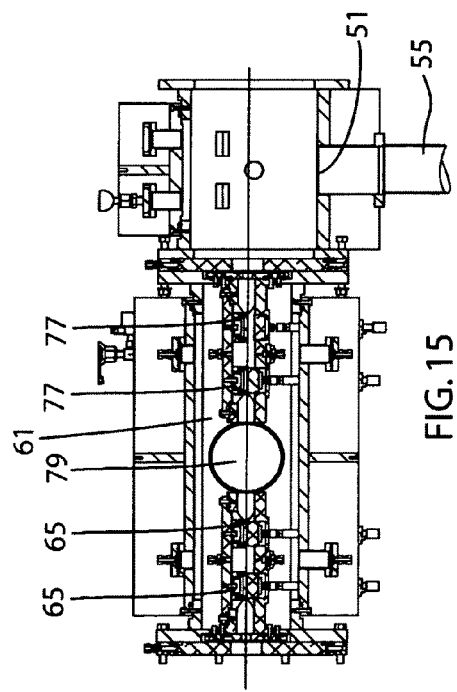
FIG. 13
FIG. 14
FIG. 15

US 8,173,477 B2

ISOLATION CHAMBER AND METHOD OF USING THE ISOLATION CHAMBER TO MAKE SOLAR CELL MATERIAL

CROSS REFERENCE TO RELATED APPLICATIONS

This application claims the benefit of U.S. provisional patent application Ser. No. 61/337,485 filed Feb. 3, 2010.

BACKGROUND OF THE INVENTION

The present invention is directed to an isolation chamber that is used as part of an in-line continuous fabrication of photovoltaic solar cell devices. The formation of such in-line continuous solar cell formation has been limited due to the vastly different environmental conditions present in the various deposition zones that are used to form the solar cell material. Because of the varying environmental conditions in the deposition zones, most solar cell material is made on more than on process line where the individual components of the solar cell material are deposited separately. As an example, the semiconductor material for the solar cell is deposited on a substrate in one forming operation and the transparent conductive top layer is applied to the semiconductor material on a separate deposition line. The use of multiple processing lines to form the solar material greatly increases the cost of production of the solar cell material. In addition, the additional, handling of the solar cell material can result in the creation of defects that significantly reduce the efficiency of the finished solar cell material. Accordingly, there is a need in the industry for an in-line continuous solar cell formation process where the semiconductor material can be applied to the substrate and a transparent conductive material can be applied to the semiconductor material in one continuous in-line process.

SUMMARY OF THE INVENTION

In an aspect of the invention, a vacuum deposition apparatus comprises a substrate payout chamber and a substrate take-up chamber. A substrate support system extends from the substrate pay-out chamber to the substrate take-up chamber. In an embodiment, the vacuum deposition apparatus further comprises a high-pressure vacuum deposition chamber and a low-pressure vacuum deposition chamber. The vacuum deposition apparatus further includes a differential process isolation unit (DPIU) disposed between the high-pressure vacuum deposition chamber and the low pressure vacuum deposition chamber. In an embodiment, the high-pressure deposition chamber is configured for forming a semiconductor (or semiconductor-containing) thin film. In an embodiment, the low-pressure deposition chamber is configured for forming a transparent conductor thin film, such as an indium tin oxide (ITO) thin film.

In an aspect of the invention, a vacuum deposition apparatus is provided, comprising, a substrate pay-out chamber and a substrate take-up chamber. The apparatus further includes a substrate support system extending from the substrate pay-out chamber to the substrate take-up chamber. In embodiments, the apparatus comprises a semiconductor vacuum deposition chamber, a transparent conductor vacuum deposition chamber, and a differential process isolation unit (DPIU) disposed between the semiconductor vacuum deposition chamber and the transparent conductor vacuum deposition chamber. In embodiments, the DPIU is configured to provide and maintain a pressure differential between the semiconductor vacuum deposition chamber and the transparent conductor vacuum deposition chamber. The DPIU prevents gases from the vacuum deposition chamber from entering the transparent conductor vacuum deposition chamber, and vice versa. In preferable embodiments, the pressure differential between the semiconductor vacuum deposition chamber and the transparent conductor vacuum deposition chamber is greater than or equal to 1:1, greater than or equal to 10:1, or greater than or equal to 100:1, or greater than or equal to 1,000:1, or greater than or equal to 10,000:1.

In another aspect of the invention, a system for forming a thin film over a substrate comprises a substrate pay-out chamber configured to provide the substrate. The system further comprises a first reaction space configured to form a semiconductor thin film over the substrate and a second reaction space configured to form a transparent conductor over the substrate. The system comprises a DPIU disposed between the first reaction space and the second reaction space, the DPIU configured to prevent one or more gases from the first reaction space from entering the second reaction space. The system further comprises a substrate take-up chamber for collecting the substrate and a substrate support system configured to move the substrate from the substrate pay-out chamber to the first reaction space, from the first reaction space to the second reaction space, and from the second reaction space to the substrate take-up chamber. In embodiments, the DPIU is configured to provide and maintain a pressure differential between the first reaction space and the second reaction space. The DPIU prevents gases from the first reaction space from entering the second reaction space, and vice versa. In preferable embodiments, the pressure differential between the first reaction space and the second reaction space is greater than or equal to 1:1, greater than or equal to 10:1, or greater than or equal to 100:1, or greater than or equal to 1,000:1, or greater than or equal to 10,000:1.

In yet another aspect of the invention, a process isolation unit (PIU) is provided, the PIU comprising a substrate support member, a first port configured to permit movement of the substrate support member into the PIU and a second port configured to permit movement of the substrate support member out of the PIU. The PIU further comprises a first conduction space between the first port and the second port, the first conduction space disposed below a substrate support member. The PIU further comprises a second conduction space between the first port and second port, the second conduction pace above the substrate support member. In embodiments, the PIU comprises a first restrictor disposed between the first conduction space and the first port and a second restrictor disposed between the first conduction space and the second port.

In yet another aspect of the invention, a method for forming a semiconductor thin film is provided, the method comprising moving a substrate from a substrate pay-out chamber to a first chamber. Next, the substrate is moved from the first chamber to a DPIU. Next, the substrate is moved from the DPIU to a second chamber. The substrate is then moved to a substrate take-up chamber. In an embodiment, the DPIU is configured to prevent gas from the first chamber from entering the second chamber, the second chamber disposed between the DPIU and the substrate take-up chamber. In an embodiment, the DPIU maintains a pressure differential (or pressure difference) between the first chamber and the second chamber. In an embodiment, prior to moving the substrate to the substrate take-up chamber, the substrate is moved to an on-line measurement chamber.

In yet another aspect of the invention, a system for forming multiple thin-film layers over a substrate comprises a substrate pay-out chamber configured to provide the substrate. The system further comprises a first reaction space configured to clean the substrate using plasma cleaning process, a second reaction space to form one or more non-semiconductor back-reflector (BR) layers over the cleaned substrate, a third reaction space to form semiconductor thin-film silicon layers over the BR coated substrate, and a fourth reaction space configured to form a non-semiconductor transparent conducting layer over the BR-layer/Si-layer coated substrate. The system further comprises two differential process isolation units. The first differential process isolation unit (DPIU) is disposed between the second reaction space for forming non-semiconductor and the third reaction space for forming semiconductor. In embodiments, the first DPIU is configured to provide and maintain a pressure differential between the second reaction space and the third reaction space, and to prevent one or more gases from the second reaction space from entering the third reaction space, and vice versa. In preferable embodiments, the pressure differential between the second reaction space and the third reaction space is less than or equal to 1:10, or less than or equal to 1:100, or less than or equal to 1:1000, or less than or equal to 1:10,000. A second DPIU disposed between the third reaction space for forming semiconductor and the fourth reaction space for forming semiconductor. In embodiments, the second DPIU is configured to provide and maintain a pressure differential between the third reaction space and the fourth reaction space, and to prevent one or more gases from the third reaction space from entering the fourth reaction space, and vice versa. In preferable embodiments, the pressure differential between the third reaction space and the fourth reaction space is greater than or equal to 10:1, or greater than or equal to 100:1, or greater than or equal to 1000:1, or greater than or equal to 10,000:1. The system further comprises a substrate take up chamber for collecting the multiple-layer coated substrate and a substrate support system configured to move the substrate from the substrate pay-out chamber to the first reaction space, from the first reaction space to the second reaction space, and then through the first DPIU to the third reaction space, and from the third reaction space through the second DPIU to the fourth reaction space, and from the fourth reaction space to the substrate take-up chamber.

The invention is directed to an isolation chamber used in the production of in-line solar cell material. An enclosed chamber is provided for the production of a solar cell material. A substrate is advanced through the enclosed chamber and the substrate is disposed for receiving the solar cell material. At least one semiconductor deposition zone is located in the enclosed chamber for applying the semiconductor material to the moving substrate. The semiconductor material is deposited in the semiconductor deposition zone in a manner that creates a relatively high pressure in a semiconductor deposition zone. A conductive material deposition zone is located in the enclosed chamber for applying a transparent conductive oxide layer on the surface of the semiconductor material. The transparent conductive oxide layer is deposited in a manner that creates a pressure in the conductive material deposition zone that is significantly less than the pressure in the semiconductor deposition zone. An isolation chamber is positioned in the enclosed chamber between the at least one semiconductor deposition zone and the conductive material deposition zone. The isolation chamber has a first chamber for receiving the substrate and semiconductor material from the semiconductor deposition zone. The first chamber defines an aperture for receiving the substrate and semiconductor material. The aperture has a height only significantly greater than the thickness of the substrate and semiconductor material whereby the aperture restricts the flow of volatile materials from the semiconductor deposition zone to the first chamber. At least one supply port is positioned on the first chamber and the supply port is in communication with the interior of the first chamber. An inert gas source is connected to the supply port. A source of vacuum is connected to an opening on the first chamber for evacuating the first chamber. The source of vacuum acts to draw volatiles from the semiconductor material and the inert gas from the interior of the first chamber. The substrate and semiconductor material pass from the first chamber at a pressure that is from about 10% to about 95% of the pressure found in the semiconductor deposition zone. In practice it has been found to be preferred if the pressure is from about 30% to about 70% of the pressure found in the semiconductor deposition zone. The isolation chamber has a second chamber for receiving the substrate and semiconductor material and the second chamber is positioned adjacent to the first chamber. A first pair of differential inserts is positioned in the second chamber and forms an entry slot for receiving the substrate and semiconductor material. The entry slot has a height that is slightly larger than the thickness of the substrate and semiconductor material whereby the entry slot functions to restrict the flow of volatile materials from the semiconductor deposition zone to the second chamber. The first pair differential inserts have at least one side made of a low friction material that engages the substrate to straighten the substrate as it passes through the second chamber. A second pair of differential inserts is positioned in the second chamber and defines an exit slot for the substrate and semiconductor material. The exit slot has a height that is only slightly greater than the height of the substrate and semiconductor material and functions to restrict the flow of volatile materials from the conductive material deposition zone to the second chamber and from the second chamber to the conductive material deposition zone. At least one supply port is positioned on the second chamber and in communication with the interior of the second chamber where the first pair of differential inserts are positioned. At least one supply port is positioned on the second chamber and in communication with the interior of the second chamber where the second pair of differential inserts are positioned. An inert gas source is connected to the supply ports on the second chamber. A source of vacuum is connected to an opening on the second chamber for evacuating the second chamber. The source of vacuum acts to draw volatiles from the semiconductor material deposition zone, the conductive material deposition zone and the inert gas from the interior of the second chamber. The substrate and semiconductor material pass from the first pair of differential inserts at a pressure that is from about 1% to about 50% of the pressure found in the first chamber. In practice it has been found to be preferable if the pressure is from about 2% to about 25% of the pressure found in the first chamber. The substrate and semiconductor material pass from the second pair of differential inserts at a pressure that is from about 0.1% to about 50% of the pressure found in the region of the second chamber where the first pair of differential inserts are located. In practice it has been found that the preferred range is from about 1% to about 10%. The first and second chambers of the isolation chamber effectively restricting the transfer of volatile materials from the semiconductor deposition zone and the conductive material deposition zone to effectively eliminate contamination of the solar cell material during the in-line formation of the solar cell material.

There is a need in the industry for an in-line continuous solar cell formation apparatus and process where the semiconductor material can be applied to a substrate and a transparent conductive oxide or other component can be applied to the semiconductor material in one continuous in-line process. To achieve such an in-line process it will be necessary to effectively isolate the varying environmental conditions in the deposition zones used to form the solar cell material. In addition, it will be necessary to accommodate significant pressure differentials in the various deposition zones to effectively eliminate cross contamination by the reactive components utilized in the deposition zones. As is known in the art, the reactive components used in the back reflector deposition zone, the semiconductor deposition zone and the transparent conductive oxide deposition zone are not compatible and any contamination of components between the deposition zones can significantly decrease the quality of the finished solar cell material. There is a need for an isolation chamber that can effectively eliminate cross contamination between deposition zones used in an in-line continuous solar cell material fabrication process. Such an isolation chamber will need to effectively separate deposition zones that have significantly different environmental conditions.

Other objects and advantages of the present invention will become apparent to those skilled in the art upon a review of the following detailed description of the preferred embodiments and the accompanying drawings.

IN THE DRAWINGS

FIG. 13 is an exploded perspective view of the isolation chamber.

FIG. 14 is an end view of the isolation chamber.

FIG. 15 is a cross sectional view taken along lines A-A in FIG. 14.

DETAILED DESCRIPTION OF THE PREFERRED EMBODIMENTS

Figure 1:
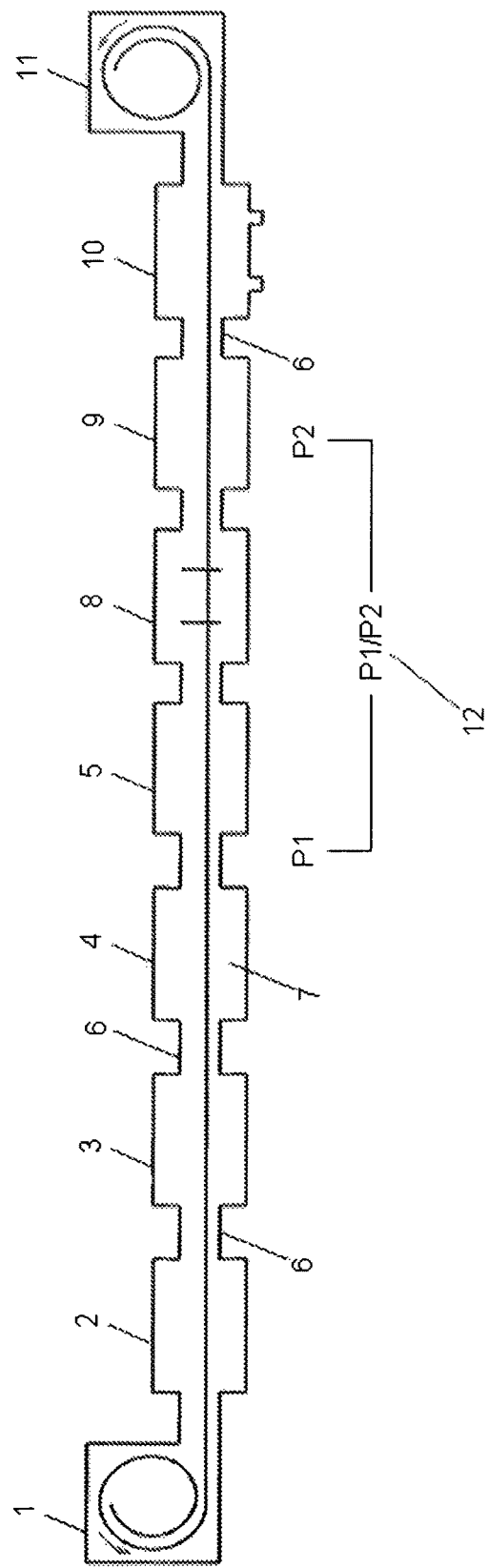
FIG. 1 is a cross-sectional side view of an integrated roll-to-roll manufacturing system with online QC measurement, in accordance with an embodiment of the invention.

Embodiments of the invention provide new roll-to-roll thin film deposition methods and apparatuses for producing large-area semiconductor and non-semiconductor thin films. Various embodiments provide systems and methods that employ a differential pumping assembly, a plasma enhanced chemical vapor deposition (PECVD) assembly for thin-film silicon based semiconductor layers, such as a-Si, a-SiGe, nc-Si, J.Ic-Si, and poly-Si layers, and a sputtering assembly for depositing a transparent conductive oxide (TCO) non-semiconductor layer, such as an indium tin oxide (ITO) layer, over a substrate. In embodiments, the substrate is provided with the aid of a roll to-roll machine. In an embodiment, depositing the ITO layer in the same machine as the thin-film silicon based layers also allows direct on-line measurements of the photovoltaic (PV) material as it is being produced. In some embodiments, plasma cleaning chambers and/or back-reflector sputter chambers may also be incorporated.

There are systems available in the art for preventing cross contamination (between vacuum chambers) when adjacent chambers are at similar pressures and using substantially the same gases. Such systems, however, are not capable of preventing cross contamination when adjacent chambers are at different pressures (e.g., a first chamber is at a higher pressure than a second chamber). In various embodiments of the present invention, systems and methods are provided having processes operating at different pressures while advantageously avoiding cross contamination. In some embodiments, cross contamination can be avoided even when different gases (down to 0% commonality in gas composition) are used in the various chambers.

Conventional processes require separate process equipments for of Si PECVD processes and ITO sputtering deposition, which requires expensive vacuum pumps, one pair more drive system, more equipment space and time consuming due to a separate PECVD process and sputtering process. The new combination of Si PECVD process and TCO sputtering process into one roll-to roll machine provided in various embodiments can allow the elimination of interleaf after the PECVD process, thus leading to a reduction in manufacturing cost. This reduction in material cost and the increase in throughput can significantly reduce overall cost of manufacture by themselves. One take-up and pay-out system is eliminated and yield is expected to be higher because intermediate wind-up is not required (winding can cause yield problems due to micro-scratches). Labor costs are lowered because one machine operator is needed instead of two, and the transfer process is eliminated. Additionally, in-process inventory will be reduced.

In embodiments of the invention, fast quality assurance (QA) or quality control (QC) is made possible by direct real-time online (also "online" herein) measurement of a completed cell structure, which can include an ITO top-contact (or top-contactor) layer. In an embodiment of the invention, rapid QAQC is made possible by forming a-Si and ITO in the same machine or apparatus, wherein the apparatus comprises a DPIU.

Roll-to-roll manufacturing apparatuses, systems and processes of embodiments of the invention include a series of deposition processes in vacuum and an online QC process. An apparatus of an embodiment of the invention comprises roll-to-roll manufacturing equipment incorporating six main parts: a transport system comprising payout, take up and guiding components; a vacuum vessel or vessels; a plasma-enhanced chemical vapor deposition (PECVD) deposition zone or reaction space for the semiconductor; a differential process isolation system; a sputter deposition zone for the top-contact; and an integrated measurement system, which can be located at a point between the top-contact sputter deposition and the take-up reel. The apparatus can also include one or more zones (or chambers) configured for physical vapor deposition, atomic layer deposition and hot-wire chemical vapor deposition. In some embodiments of the invention, the apparatus can include one or more zones configured for a hybrid CVD process combining PECVD and hot-wire CVD, as described in U.S. patent application Ser. No. 12/168,833, filed on Jul. 7, 2008, which is entirely incorporated herein by reference. This system allows fabrication of semiconductor and top contact layers in a single pass and provides on-line quality control data.

In embodiments of the invention, roll-to-roll vacuum deposition apparatuses or systems comprises a pay-out chamber; a take-up chamber; a substrate support system; at least one semiconductor vacuum deposition chamber; at least one transparent conductor vacuum deposition chamber; at least one DPIU located between deposition chambers; and at least one real-time online performance measurement chamber. In an embodiment of the invention, the at least one semiconductor vacuum deposition chamber is configured to deposit thin-film silicon or thin-film silicon alloys. In another embodiment of the invention, the at least one transparent conductor vacuum deposition chamber is configured to deposit indium-tin oxide (ITO). In yet another embodiment of the invention, the at least one transparent conductor vacuum deposition chamber is configured to deposit any transparent conductive (or conducting) oxide (TCO). In yet another embodiment of the invention, the real-time online measurement system can be located between the transparent conductor deposition chamber and the take-up chamber. In still another embodiment of the invention, the real-time online measurement system can comprise a current-voltage (IV) measurement system. In still another embodiment of the invention, the real-time online measurement system can comprise a cell isolation system. The cell isolation system can comprise a laser scriber.

In other embodiments of the invention, roll-to-roll vacuum deposition apparatuses or systems comprise a pay-out chamber; a take-up chamber; a substrate support system; at least one semiconductor vacuum deposition chamber; at least one transparent conductor vacuum deposition chamber; and at least one DPIU located between deposition chambers. Roll-to-roll vacuum deposition apparatuses of embodiments of the invention can be configured to deposit thin film silicon or thin film silicon alloys, in addition to indium-tin oxide. In an embodiment of the invention, the at least one semiconductor vacuum deposition chamber is configured to deposit thin film silicon or thin film silicon alloys. In another embodiment of the invention, the at least one transparent conductor vacuum deposition chamber is configured to deposit indium-tin oxide (ITO). In yet another embodiment of the invention, the at least one transparent conductor vacuum deposition chamber is configured to deposit any transparent conductive (or conducting) oxide (TCO).

In embodiments of the invention, the roll-to-roll vacuum deposition apparatus comprises a computer system configured to control the formation of solar cells. The computer system can collect QAQC data during online QAQC measurements. The computer system can also control the rate at which films are deposited over a substrate during solar cell formation. Accordingly, the computer system can control chamber pressures, flow rates of one or more reactants into vacuum chambers during deposition, and the rate at which a substrate is moved through a vacuum chamber during thin film deposition.

In embodiments of the invention, an a-Si layer can be formed at a pressure greater than about 0.05 Torr, or greater than about 0.1 Torr, or greater than about 0.5 Torr, and an ITO layer can be formed at a pressure below about 0.1 Torr, or below about 0.05 Torr, or below about 0.005 Torr. In an embodiment, the ITO layer can be formed at a pressure less than or equal to about 0.001 Torr.

In an aspect of the invention, a vacuum deposition apparatus comprises a substrate payout chamber and a substrate take-up chamber.

The vacuum deposition apparatus further comprises a substrate support system extending from the substrate pay-out chamber to the substrate take-up chamber. For example, the substrate support system could incorporate the magnetic roller that is the subject of D.S. Provisional Patent Application Ser. No. 61/212,614, filed on Jun. 3, 2009, which is hereby incorporated by reference in its entirety. The vacuum deposition apparatus also comprises a first vacuum deposition chamber and a second vacuum deposition chamber.

In an embodiment, the first vacuum deposition chamber (also "reaction chamber" herein) is a high-pressure vacuum deposition chamber and the second vacuum deposition chamber is a low pressure vacuum deposition chamber. In an embodiment, the pressure in the high-pressure vacuum deposition chamber is greater than the pressure in the low-pressure vacuum deposition chamber. In one example, a high-pressure vacuum deposition chamber may have a pressure within the range of 0.1 to 20 Torr, and a low-pressure vacuum deposition chamber may have a pressure within the range of 0.0001 to 2 Torr. The vacuum deposition apparatus further comprises a differential process isolation unit ("DPIU"). In an embodiment, the DPIU is disposed between the high-pressure vacuum deposition chamber and the low-pressure vacuum deposition chamber. In an embodiment, the DPIU is configured to maintain a pressure differential between the high pressure vacuum deposition chamber and the low-pressure vacuum deposition chamber. In embodiments, with P1 designating the pressure in the high-pressure vacuum deposition chamber and P2 designating the pressure in the low-pressure vacuum deposition chamber, the DPIU is configured to maintain a pressure differential, P1/P2, greater than or equal to about 1:1, greater than or equal to about 10:1, or greater than or equal to about 100:1, or greater than or equal to about 1,000:1, or greater than or equal to about 10:000:1.

In an embodiment, the first vacuum deposition chamber is configured to form one of a pdoped or n-doped semiconductor thin film over the substrate. In an embodiment, the vacuum deposition apparatus includes a third vapor deposition chamber between the first vapor deposition chamber and the DPIU. The third vapor deposition chamber is configured to form an intrinsic semiconductor thin film over the substrate. In an embodiment, the vacuum deposition apparatus further includes a fourth vapor deposition chamber between the third vapor deposition chamber and the DPIU, the fourth vapor deposition chamber configured to form the other of the p-doped or n-doped semiconductor thin film over the substrate. In an embodiment, the first vapor deposition chamber is configured to form an n-doped (n-type semiconductor) semiconductor thin film, the third vapor deposition chamber is configured to form an intrinsic semiconductor thin film, and the fourth vapor deposition chamber is configured to form a p-doped semiconductor thin film. In another embodiment, the first vapor deposition chamber is configured to form a p-doped (p-type semiconductor) semiconductor thin film, the third vapor deposition chamber is configured to form an intrinsic semiconductor thin film, and the fourth vapor deposition chamber is configured to form an n-doped semiconductor thin film.

"Reaction space" is used to designate a reactor, reaction chamber, vacuum deposition chamber, vacuum deposition reactor, or an arbitrarily defined volume in which conditions can be adjusted to effect thin film growth over a substrate by various vacuum deposition methods, such as, e.g., chemical vapor deposition (CVD), atomic layer deposition (ALD), physical vapor deposition (PVD), sputtering and evaporation, including plasma-enhanced variations of the aforementioned methods. The reaction space can include surfaces subject to all reaction gas pulses from which vapor phases chemicals (or gases) or particles can flow to the substrate, by entrained flow or diffusion, during normal operation. The reaction space can be, for example, a plasma-enhanced CVD (PECVD) reaction chamber in a roll-to-roll system of embodiments of the invention. As another example, the reaction space can be a vacuum deposition chamber configured for forming a transparent conductor thin film over a substrate, such as an ITO thin film (or layer).

Reference will now be made to the figures, wherein like numerals refer to like parts throughout. It will be appreciated that the figures are not necessarily drawn to scale.

With reference to FIG. 1, an integrated roll-to-roll manufacturing system or apparatus with online QC measurement is shown, in accordance with an embodiment of the invention. A coil of substrate material is loaded into payout chamber 1 and guided through a pre-treatment chamber 2, an n-doped deposition chamber 3, an intrinsic deposition chamber 4, and a p-doped deposition chamber 5. Each deposition chamber may be connected to the adjacent chamber by bridge chambers 6, the bridge chambers 6 constructed to allow free passage of a substrate web (also "web" herein) 7 while blocking substantially the flow of dopant materials from one deposition chamber (or reaction space) to the adjacent deposition chamber. Further, the substrate web is guided through a DPIU 8, the DPIU 8 being constructed to allow free movement of the web while blocking flow of gas across it to an extent that a pressure differential (or pressure difference) 12 is created and maintained and preventing any cross-contamination from one port to the other. The web 7 is further guided through a top-contact deposition chamber 9 and a bridge chamber 6 into an online measurement chamber 10, and finally into take-up chamber 11, where it is wound up. In embodiments of the invention, the pressure differential 12 is such that PI is greater than P2, and the ratio PI/P2 is greater than or equal to about 10, or greater than or equal to about 100, or greater than or equal to about 1,000, or greater than or equal to about 10,000. In other embodiments, the pressure differential 12 is such that PI is less than P2, and the ratio P2/PI is greater than or equal to about 10, or greater than or equal to about 100, or greater than or equal to about 1,000, or greater than or equal to about 10,000. In an embodiment, the pressure differential 12 is maintained while a substrate is being transported or moved through the deposition chambers and the online measurement chamber.

Many variations of the apparatus of FIG. 1 are possible. For example, the number of deposition chambers could be increased or decreased (e.g., the system of FIG. 1 could have 1, 2, or 3 chambers or reaction spaces). As another example, a second sputter zone and corresponding DPIU could be incorporated before the semiconductor deposition zone to allow fabrication of back reflectors. As another example, a plasma cleaning chamber could be incorporated before the semiconductor deposition zone or before the back-reflector sputter zone, along with corresponding DPIUs as required. As yet another example, the DPIU (also "process DPIU" herein) could be designed with wrap angles of zero degrees, or 90 degrees or 180 degrees, or indeed any value practical to the layout of the machine. As still another example, the online measurement chamber 10 and take-up chamber 11 could be combined into a single chamber.

With continued reference to FIG. 1, in an embodiment, the apparatus can further include a back-reflector deposition chamber (not shown) for forming a back reflector. The back reflector deposition chamber can be disposed prior to any vacuum deposition chambers (e.g., between the substrate pay-out chamber and the pre-treatment chamber 2). In an embodiment, the pre-treatment chamber 2 can be configured for plasma cleaning a substrate prior to thin film deposition. In such a case, the pre-treatment chamber 2 can be referred to as a plasma cleaning chamber. Plasma cleaning can be performed via ion sputtering (e.g., Ar ion sputtering).

Figure 2:
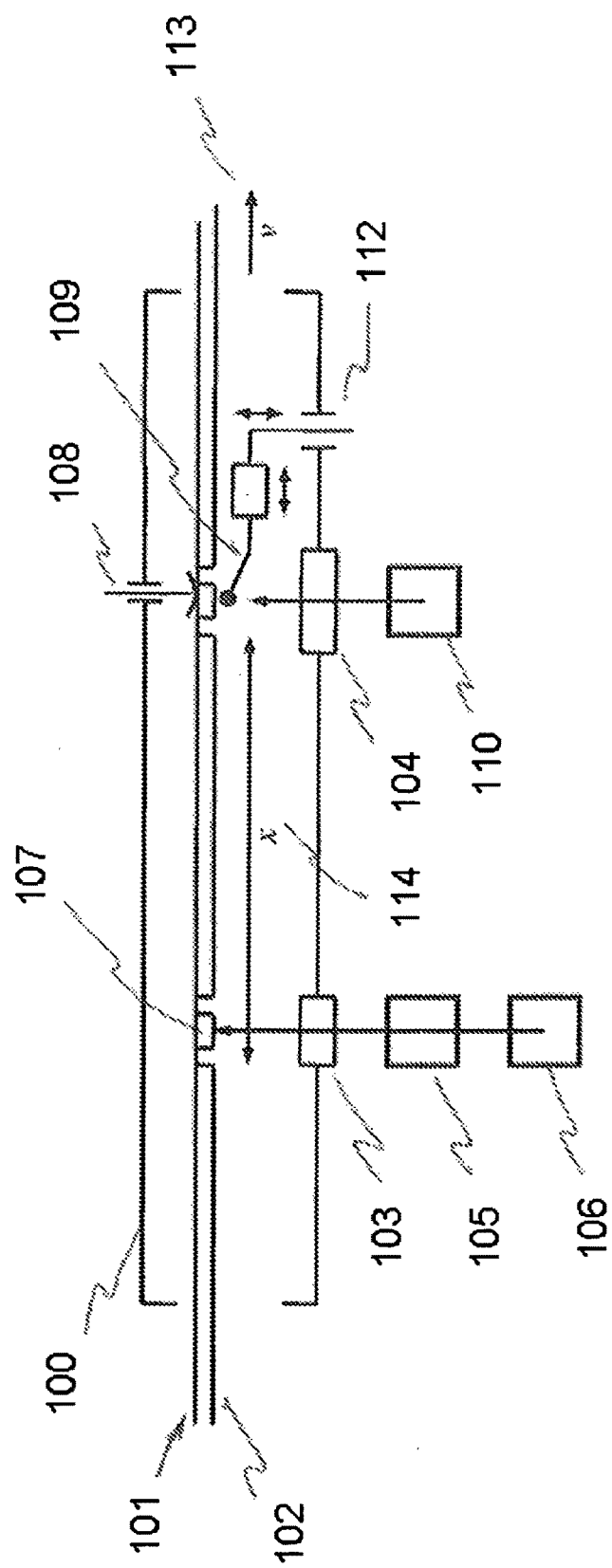
FIG. 2 is a cross-sectional side view of an online measurement chamber, in accordance with an embodiment of the invention

FIG. 2 shows an online performance measurement chamber 100, in accordance with an embodiment of the invention.

With reference to FIG. 2, a laser scribing system comprising source 106 and optics 105 is mounted near the first window 103 such that the optics have an unobstructed view of the coated substrate web 101 as it moves past the window with velocity v (113). In an embodiment, the laser scribing system is capable of scribing away the TCO layer 102, thereby isolating a portion 107 of the cell-web. In an embodiment, the scribing system (or optics) can be constructed to allow isolation of a small portion at any location across the width of the web, for example by mounting it on a linear translation stage parallel to the first window. In an embodiment, the scribing system can be used to create multiple small cells across the width of the web as it moves past the first window.

With continued reference to FIG. 2, a light source 110 can be provided outside the chamber, positioned such that it illuminates the isolated small cells as they move past the second window 104. When a small cell is illuminated, a moveable (or retractable) electrical probe 109 inside the vacuum vessel can be brought in contact with the cell and an IV (i.e., current-voltage) measurement can be taken. In an embodiment, the location x (114) of the measurement probe and the velocity v (113) of the web can be used to determine the time of measurement. Alternatively, the location of the cell to be measured can be determined by an optical inspection system. In an embodiment, a measurement can be taken with an electrical or electrostatic probe in contact with (or in sufficiently close proximity to) the isolated cells. In an embodiment, the construction of the probe is selected so as not to substantially damage the small cell during measurement. In an embodiment, the probe assembly can be moved across the web to measure isolated small cells that are located at different positions across the width of the web as the web is moving. The probe assembly can be housed in the chamber, or can be manipulated through feed through 112.

Many variations of the apparatus of FIG. 2 are possible. For example, the moveable probe assembly could be replaced with multiple probes. As another example, the moveable laser scriber could be replaced with multiple scribers. As yet another example, the first and second windows could be replaced with a single window large enough to accommodate both the laser scribe beam and the measurement illumination beam. As still another example, the light sources could be located within the vacuum vessel. This could eliminate the need for a window. As still another example, the laser scribing system, or a portion thereof, could be located within the vacuum vessel. This could eliminate the need for a window or allow the use of a smaller window.

Figure 3:
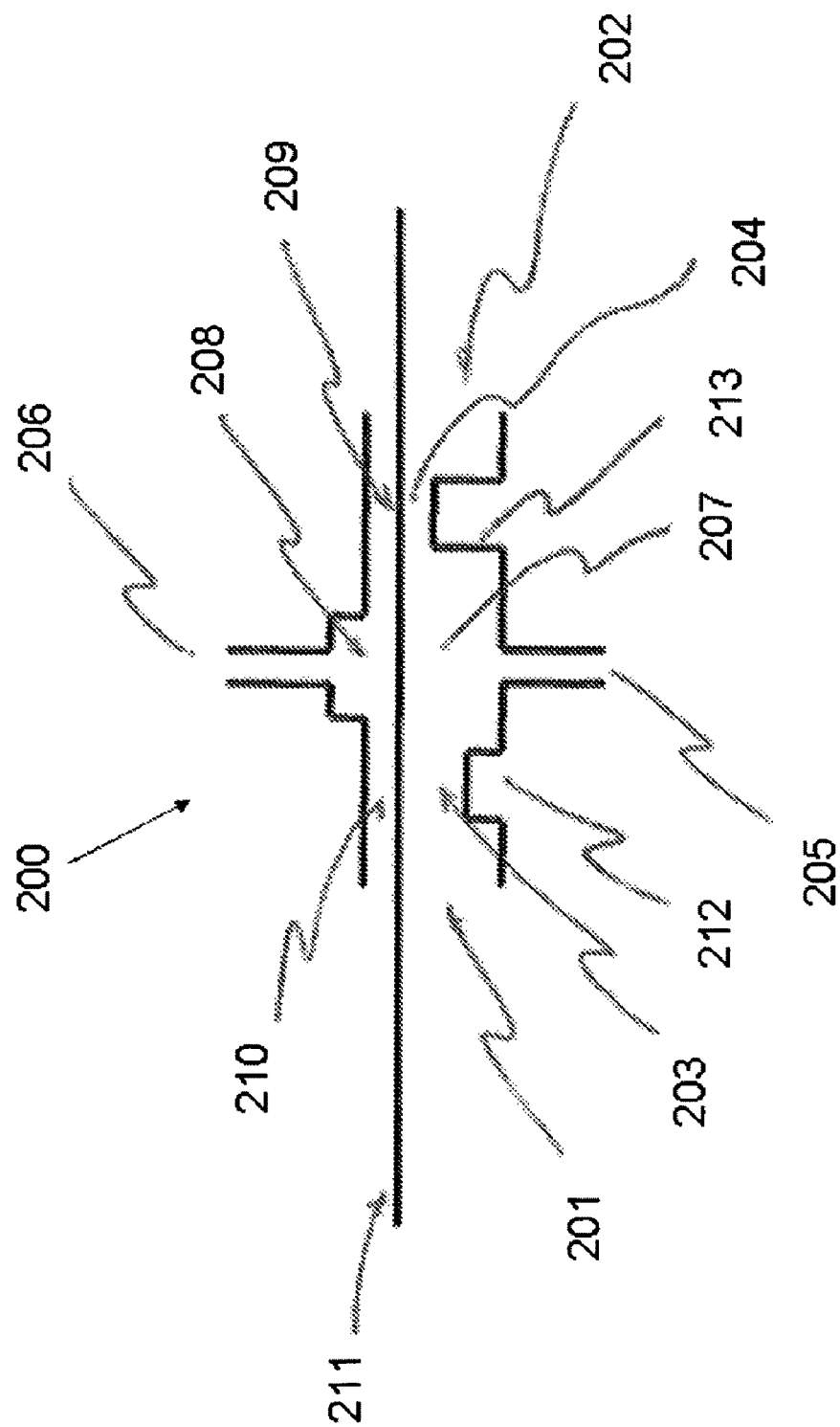
FIG. 3 is a cross-sectional aide view of a process isolation unit (PIU), in accordance with an embodiment of the invention.

FIG. 3 shows a process isolation unit (PIU) 200 that is capable of maintaining a pressure differential across its two ports while allowing substantially no flow of gas from the first port to the second port, and vice-versa. In an embodiment, the PIU of FIG. 3 can be disposed in an PIU located between a first reaction space (or chamber) and a second reaction space, the PIU configured to prevent the flow of gas from the first reaction chamber into the second reaction chamber while permitting the movement of a substrate from the first reaction chamber to the second reaction chamber.

With reference to FIG. 3, the process isolation unit 200 comprises a first port (or inlet) 201 and a second port 202, each individually constructed to allow free movement of gas and substrate a substrate support member 211 having a substrate. In an embodiment, the substrate support member 211 is a substrate web. The first port 201 and second port 202 are on figured to permit the movement of the substrate support member 211 into and out of the PIU 200. In an embodiment, the first port 201 is configured to permit movement of the substrate support member 211 into the isolation unit 200 and the second port 202 is configured to permit movement of the substrate support member 211 out of the PIU 200. In an alternative embodiment, the first port 201 is configured to permit movement of the substrate support member 211 out of the PIU 200 and the second port 202 is configured to permit movement of the substrate support member 211 into the PIU 200.

With continued reference to FIG. 3, the PIU 200 further comprises a first conduction space 207 and a second conduction space 208 between the first port 201 and the second port 202. In the illustrated embodiment, the first conduction space 207 is disposed below the substrate support member 211 and the second conduction space 208 is disposed above the substrate support member 211. One or more gases (also "vapor phase chemicals" herein) can be admitted into the first conduction space 207 through a first sweep gas inlet (or inlet port) 205. Gas can be admitted into the second conduction space 208 through a second sweep gas inlet 20(>. The first and second sweep gas inlets 205, 206 can be configured to admit any sweep gas, such as, e.g., one or more of H2, N2, He, Ne and Ar.

In accordance with some embodiments of the invention, a sweep gas inlet (e.g., 205, 206) may have a desired cross sectional area or shape. In some embodiments, multiple sweep gas inlets may be provided. The sweet gas inlets may have the same cross sectional area and/or shape, or the cross sectional area and/or shape of the sweet gas inlets may vary. In some instances, the cross sectional areas of one or more sweep gas inlets 205, 206 may be smaller than the cross sectional areas of a first conduction space 207 a second conduction space 208, a third conduction space 210, a fourth conductance space 209, a first conductance 203, and/or a second conductance 204. Alternatively, the cross sectional areas of one or more sweep gas inlets 205, 206 may be greater than the cross sectional areas of a third conductance space 210, a fourth conductance space 209, a first conductance 203, and/or a second conductance 204.

With continued reference to FIG. 3, in certain embodiments, the conduction spaces are in fluid communication with each other. In some embodiments, the conduction spaces 207 and 208 are combined into a single space, the single space being in fluid communication with a single sweep gas inlet port. A first restrictor (or gas restrictor) 212 is disposed between the first conduction space 207 and the first port 201, positioned to provide a first conductance 203. Located between the first conduction spaces 207 and second port 202 is a second restrictor 213, positioned to provide a second conductance 204. In an embodiment, on the side of the substrate away from the restrictors is a third conduction space 210 connecting the first port 201 to the second conduction space 208. On the side of the substrate away from the restrictors, there is a fourth conduction space 209 connecting the second port 202 to the second conduction space 208. In a preferable embodiment, the spaces 209 and 210 can have substantially smaller conductances than either of the conductance's 203 and 204.

In some embodiments, the first conductance 203 can be substantially different in magnitude than the second conductance 204. In an embodiment, the first conductance 203 is larger than the second conductance 204. In another embodiment, the first conductance 203 is smaller than the second conductance 204. In certain embodiments, the geometry of the restrictors 212 and 213 can be changed to effect a change in the conductance's 203 and 204. In an embodiment, the geometry of the restrictors 212 and 213 is selected so as to provide conductances 203 and 204 that 19-effect a pressure drop across the restrictors 212 and 213 as desired. In an embodiment, the first and second restrictors 212, 213 can be walls disposed within the PIU 200.

In other words, the first and second restrictors can be selected such that the first conductance 203 and the second conductance 204 may have a desired cross sectional area. For example, the first conductance may have a greater cross sectional area than the second conductance or vice versa. For example, the cross sectional areas of the first conductance and second conductance may vary such that the ratio of their areas may be on the order of about 100:1, 50:1, 20:1, 10:1, 5:1, 3:1, 2:1, 1:1, or the other way around. The first and second restrictions may also be selected so the first conductance and the second conductance may have a desired cross-sectional shape. For example, the first and second conductance may form a circle, square, rectangle, trapezoid, triangle, hexagon, octagon, or any other geometric shape.

Figure 4:
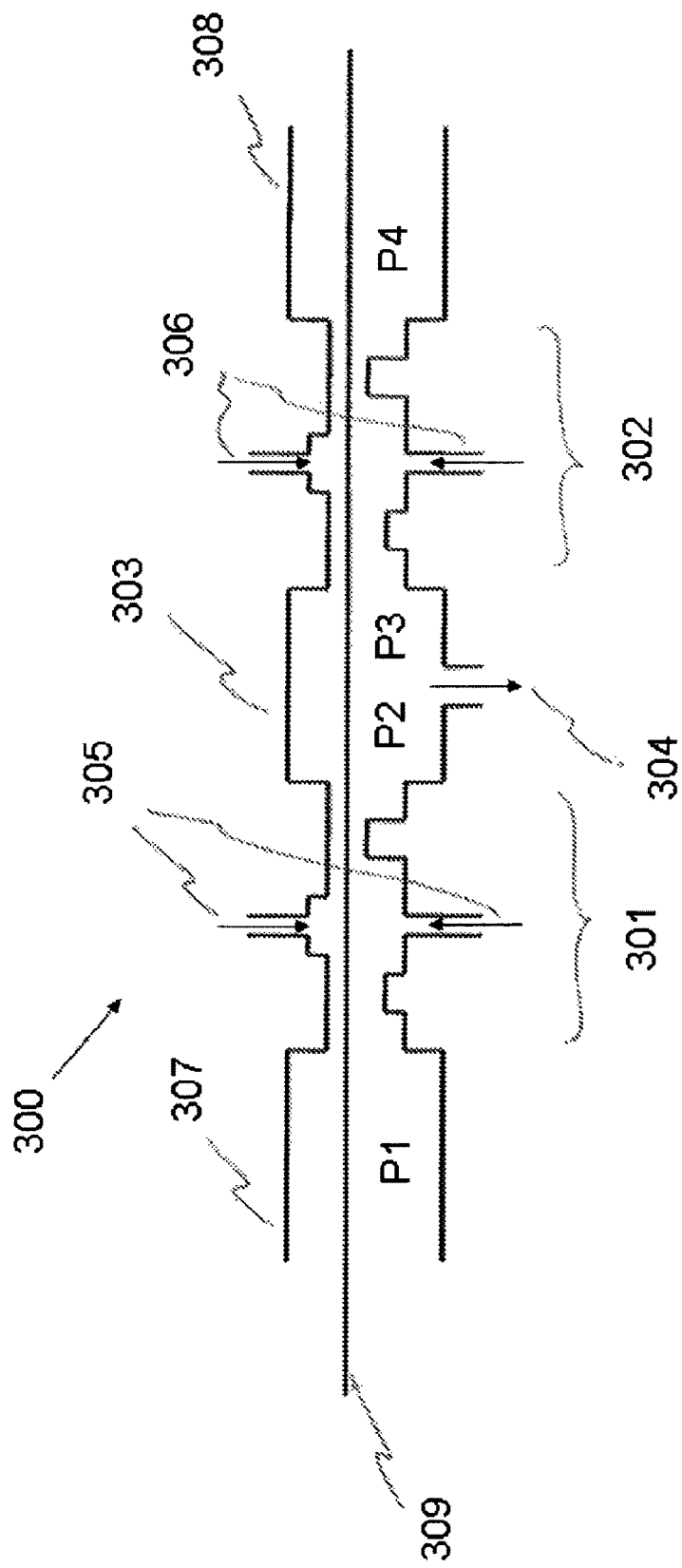
FIG. 4 is a cross-sectional side view of a differential process isolation unit (DPIU) system, in accordance with an embodiment of the invention.

With reference to FIG. 4, a DPIU (also "isolation system" herein) 300 capable of maintaining a pressure differential between two deposition spaces (or reaction spaces) is shown, allowing substantially no cross contamination of gases between the two deposition spaces (or chambers), while allowing free movement of a substrate web (or substrate support member). In embodiments, the DPIU 300 is configured to maintain a pressure differential greater than or equal to about 10:1, or greater than or equal to about 100:1, or greater than or equal to about 1000:1, or greater than or equal to about 10,000:1. In an embodiment, the differential process isolation unit (DPIU) 300 of FIG. 4 can include the PIU 200 of FIG. 3. In some cases, the DPIU can include multiple PIUs.

With continued reference to FIG. 4, the DPIU 300 comprises an evacuation space 303 in fluid communication with a first PIU 301 and a second PIU 302. One port of the first PIU 301 is connected to a first deposition space 307 while a second port of the first PIU 301 is connected to the evacuation space 303. One port of the second PIU 302 is connected to a second deposition space 308 and a second port of the second PIU 302 is connected to the evacuation space 303. In an embodiment, the pressure in the first deposition space 307 is greater than the pressure in the second deposition space 308.

With continued reference to FIG. 4, the pressure in the first deposition space 307 proximate the first PIU 301 is 'PI'. The pressure in the second deposition space 308 proximate the second PIU 302 is 'P4'. The pressure in the evacuation space 303 proximate the first PIU 301 is 'P2'. The pressure in the evacuation space 303 proximate the second PIU 302 is 'P3'. Sweep gas is admitted into the first PIU 301 via first sweep gas inlet ports 305. Sweep gas is admitted into the second PIU 302 via second sweep gas inlet ports 306. A substrate 309 can move freely from the first deposition space 307 to the second deposition space 308, and vice versa.

In embodiments, the DPIU is configured to maintain a pressure differential between the first and second deposition spaces in excess of about 1:10, or in excess of about 1:100, or in excess of about 1:1000, or in excess of about 1:10,000. In one embodiment, the ratio between PI and P4 (i.e., P1/P4) is greater than equal to about 10 (i.e., 10:1), or greater than equal to about 100 (i.e., 100:1), or greater than equal to about 1,000 (i.e., 1,000:1), or greater than equal to about 10,000 (i.e., 10,000:1). In another embodiment, the ratio between P4 and PI (i.e., P4/PI) is greater than or equal to about 10, or greater than or equal to about 100, or greater than or equal to about 1,000, or greater than or equal to about 10,000. In a preferable embodiment, the pressure differential is maintained while the substrate 309 is moved (or directed) through the first deposition space 307 and the second deposition space 308. The substrate 309 can be moved through the deposition spaces with the aid of a substrate support member, such as a substrate support roller.

Figure 5:
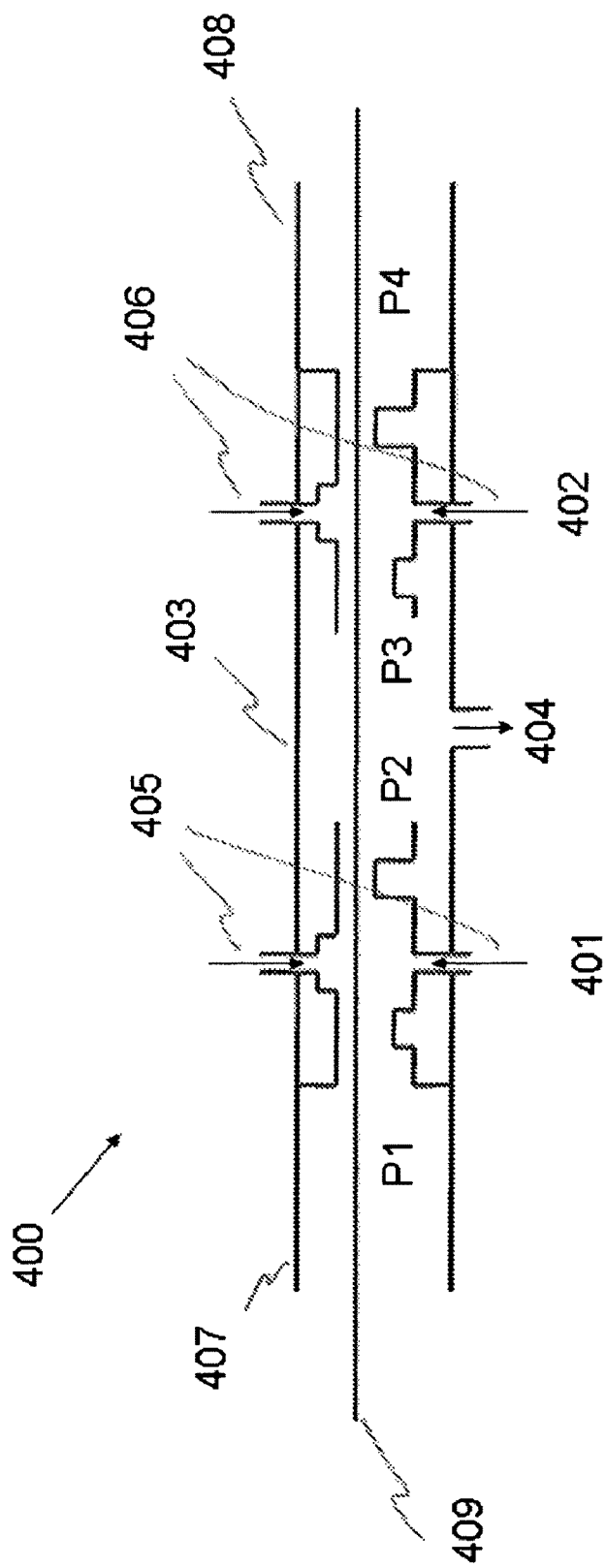
FIG. 5 is a cross-sectional side view of a differential process isolation unit (DPIU), in accordance with an embodiment of the invention.

FIG. 5 illustrates a DPIU 400 configured to maintain a pressure differential between a plurality of deposition spaces, allowing substantially no cross contamination of gases between the plurality of deposition spaces, while allowing free movement of a substrate support member (e.g., substrate web). In an embodiment, the DPIU 400 is a differential pumping chamber that is in fluid communication with a vacuum system. In such a case, the DPIU 400 can be described as a DPIU (or differential process isolation unit). In an embodiment, the DPIU 400 is configured to maintain a pressure differential between two deposition spaces. In embodiments, the DPIU 400 is configured to maintain a pressure differential (or difference) greater than or equal to about 10:1, or greater than or equal to about 100:1, greater than or equal to about 1000:1, or greater than or equal to about 10,000:1. In embodiments, the DPIU 400 is configured to maintain a first pressure on one side of the DPIU 400 and a second pressure on the other side of the DPIU 400, wherein the first pressure is between about 0.1 Torr and 20 Torr, and wherein the second pressure is less than or equal to about 0.01 Torr, or less than or equal to about 0.001 Torr.

With continued reference to FIG. 5, the DPIU 400 comprises an evacuation space 403 in fluid communication with a first PIU 401 and a second PIU 402. One port of the first PIU 401 is connected to (or adjacent) a first deposition space 407 while a second port of PIU 401 is connected to the evacuation space 403. One port of the second PIU 402 is connected to a second deposition space 408 and a second port of PIU 402 is connected to the evacuation space 403. The pressure in the first deposition space 407 proximate the first PIU 401 is 'PI'. The pressure in the second deposition space 408 proximate the second PIU 402 is 'P4'. The pressure in the evacuation space 403 proximate the first PIU 401 is 'P2'. The pressure in the evacuation space 403 proximate the second PIU 402 is 'P3'. A first sweep gas can be provided into the first PIU 401 via inlet ports 405.

A second sweep gas can be admitted into the second PIU 402 via inlet ports 406. The first and second sweep gases are removed from the evacuation space via exhaust (or outlet) port 404. In an embodiment, gas is exhausted from the evacuation space 403 with the aid of a vacuum pumping system having, e.g., a mechanical pump or a turbo molecular ("turbo") pump. In an embodiment, the first sweep gas is hydrogen (H2) or helium (He), or a mixture having H2 or He, and the second sweep gas is argon (Ar), neon (Ne) or He, or a mixture containing AT, Ne, or He. In preferable embodiments, the first sweep gas is chosen to be benign to the process in first deposition space 407 (i.e., the first sweep gas is substantially non reactive with one or more vapors or gases in the first deposition space 407), and the second sweep gas is chosen to be benign to the process in the second deposition space 408 (i.e., the second sweep gas is substantially non reactive with one or more gases in the second deposition space 408). In an embodiment, the first sweep gas and second sweep gas are the same gas.

While the DPIU 400 includes two inlet ports 405 and two inlet ports 406, it will be appreciated that the system 400 can include any number of inlet ports. For example, the system can include one inlet port 405 and two inlet ports 406. As another example, the system can include 2 inlet ports 405 and three inlet ports 406. The inlet ports can be distributed and sized as desired to provide a pressure differential of embodiments of the invention.

In an embodiment, the DPIU 400 is configured to maintain PI between about 0.1 Torr and about 20 Torr, and P4 less than or equal to about 0.1 Torr, or less than or equal to about 0.01 Torr. In another embodiment, the DPIU 400 is configured to maintain P4 between about 0.1 Torr and about 20 Torr, and PI less than or equal to about 0.01 Torr, or less than or equal to about 0.001 Torr. In embodiments, the DPIU 400 maintains PI and P4 at certain levels while a substrate is directed through the first deposition space 407 and the second deposition space 408.

In embodiments, the first deposition chamber 407 is configured to deposit a semiconductor-containing material over a substrate and the second deposition chamber 408 is configure to form a transparent conductor layer (i.e., the second deposition chamber 408 is a transparent conductor deposition chamber) over the substrate. In an embodiment, PI is greater than P4, or substantially greater than P4.

In embodiments, the first deposition space 407 is configured for vapor phase deposition. In an embodiment, the first deposition space 407 is configured for chemical vapor deposition (CVD). In another embodiment, the first deposition space 407 is configured for atomic layer deposition (ALD). In an embodiment, the first deposition space 407 can be configured for plasma-enhanced CVD or ALD. In embodiments, the second deposition space 408 is configured for forming a transparent conductor over a substrate. In an embodiment, the second deposition space 408 is configured for ion sputtering. In another embodiment, the second deposition space 408 is configured for physical vapor deposition. In an embodiment, the second deposition 408 is configured for deposition an indium tin oxide thin film over a substrate.

In embodiments, a substrate can move freely from the first deposition space 407 to the second deposition space 408, and vice versa. The substrate can be provided with the aid of a substrate support member 409. The substrate support member 409 can be part of a roll-to-roll deposition system (see FIG. 1). In an embodiment, the substrate support member 409 can be a substrate web.

Example 1

Figure 6:
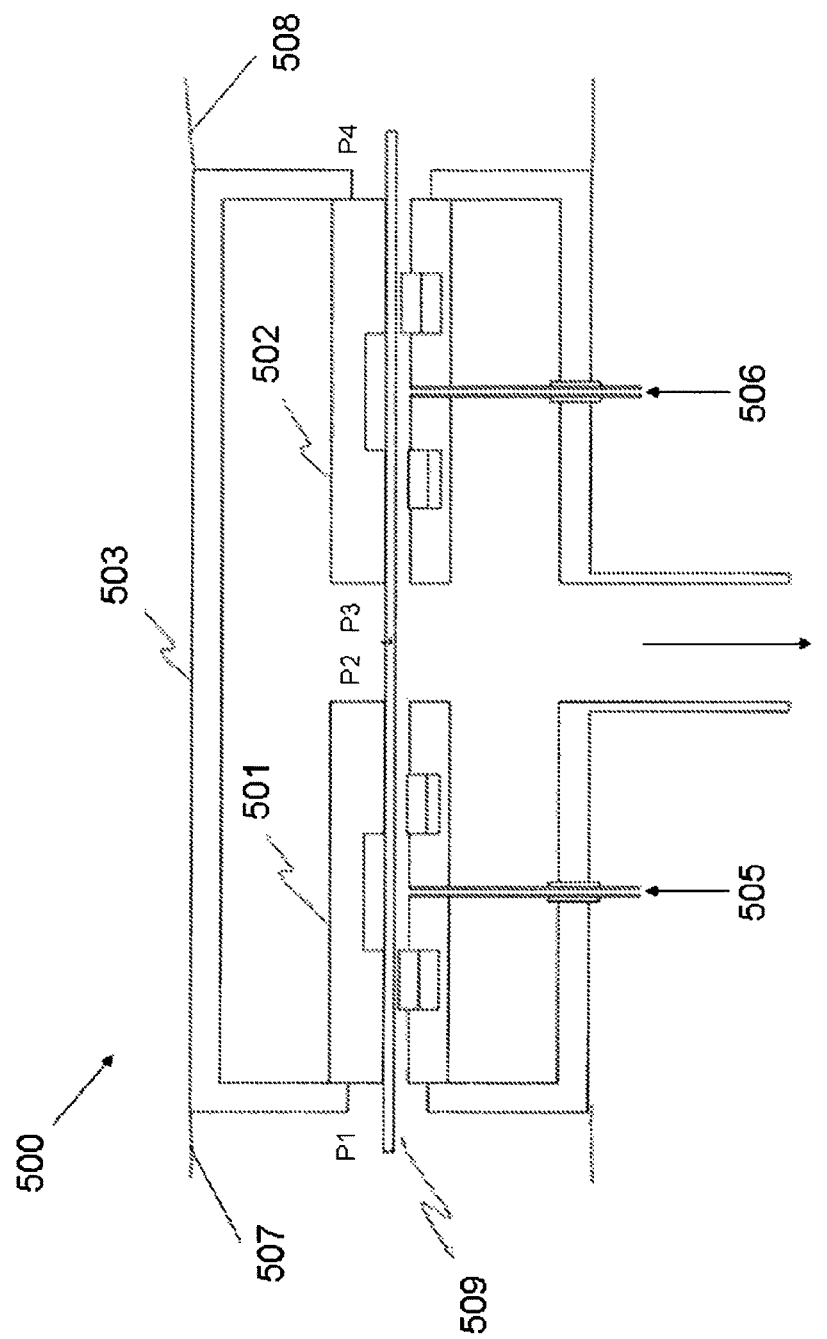
FIG. 6 is a cross-sectional side view of a differential process isolation unit (DPIU), in accordance with an embodiment of the invention.

FIG. 6 illustrates a DPIU 500 comprising an evacuation space 503 in fluid communication with a first PIU 501 and a second PIU 502. One port of the first PIU 501 is connected to a first deposition space 507 while a second port of PIU 501 is connected to the evacuation space 503. One port of the second PIU 502 is connected to a second deposition space 508 and a second port of PIU 502 is connected to the evacuation space 503. The pressure in the first deposition space 507 proximate the first PIU 501 is 'P1'. The pressure in the second deposition space 508 proximate the second PIU 502 is 'P4'. The pressure in the evacuation space 503 proximate the first PIU 501 is 'P2'. The pressure in the evacuation space 403 proximate the second PIU 502 is 'P3'. A first sweep gas (e.g., H2) is provided into the first PIU 501 via inlet port 505. A second sweep gas (e.g., Ar) is admitted into the second PIU 502 via inlet port 506. The first and second sweep gases are removed from the evacuation space 503 via exhaust (or outlet) port 504. Gas can be exhausted from the evacuation space 503 with the aid of a vacuum pumping system having, e.g., a mechanical pump or a turbo molecular ("turbo") pump.

Example 2

Figure 7:
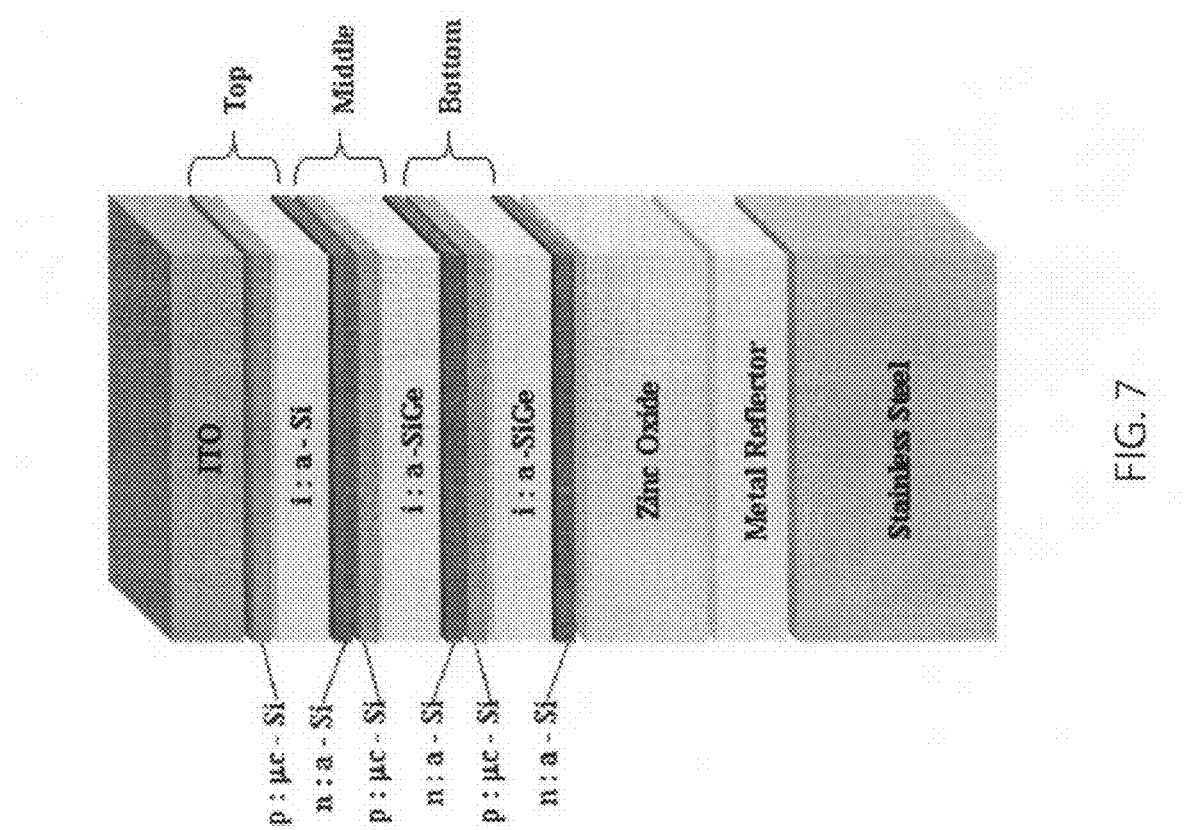
FIG. 7 illustrates a photovoltaic (or solar cell) device formed using a plurality of roll-to roll production systems, in accordance with an embodiment of the invention.
Figure 8:
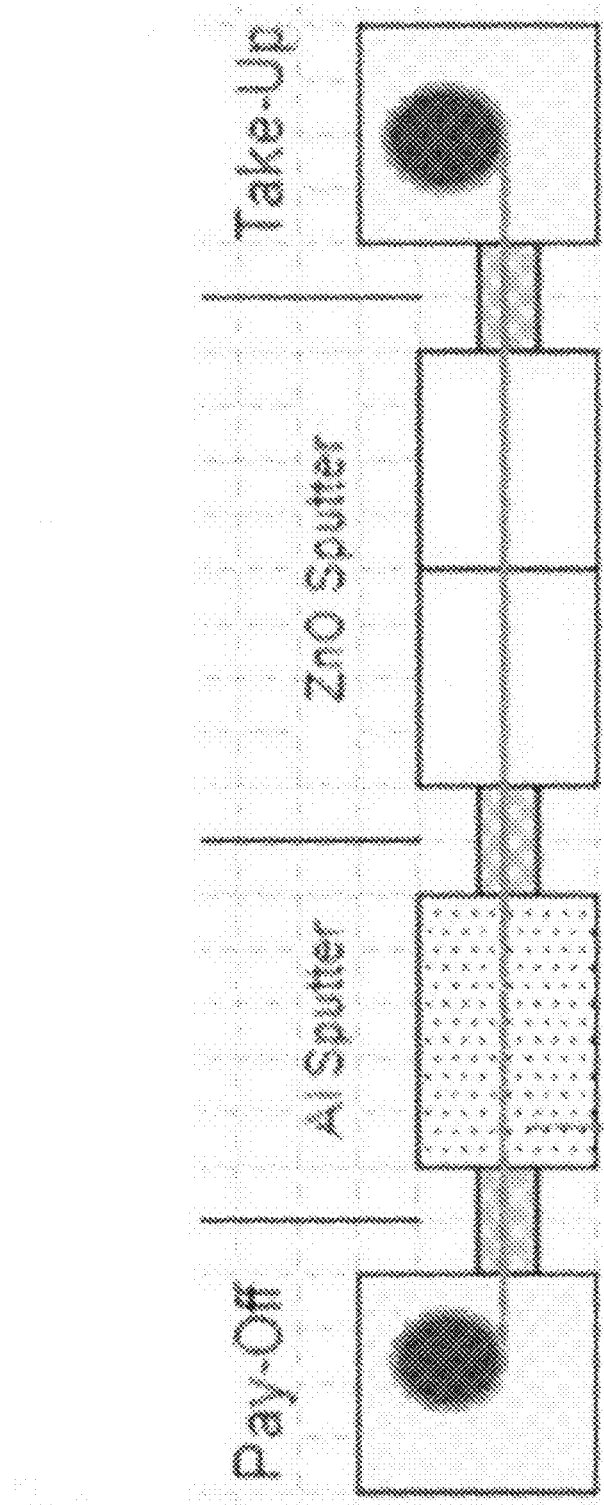
FIG. 8 is a cross-sectional side view of a back reflector roll-to-roll production machine, in accordance with an embodiment of the invention.
Figure 9:
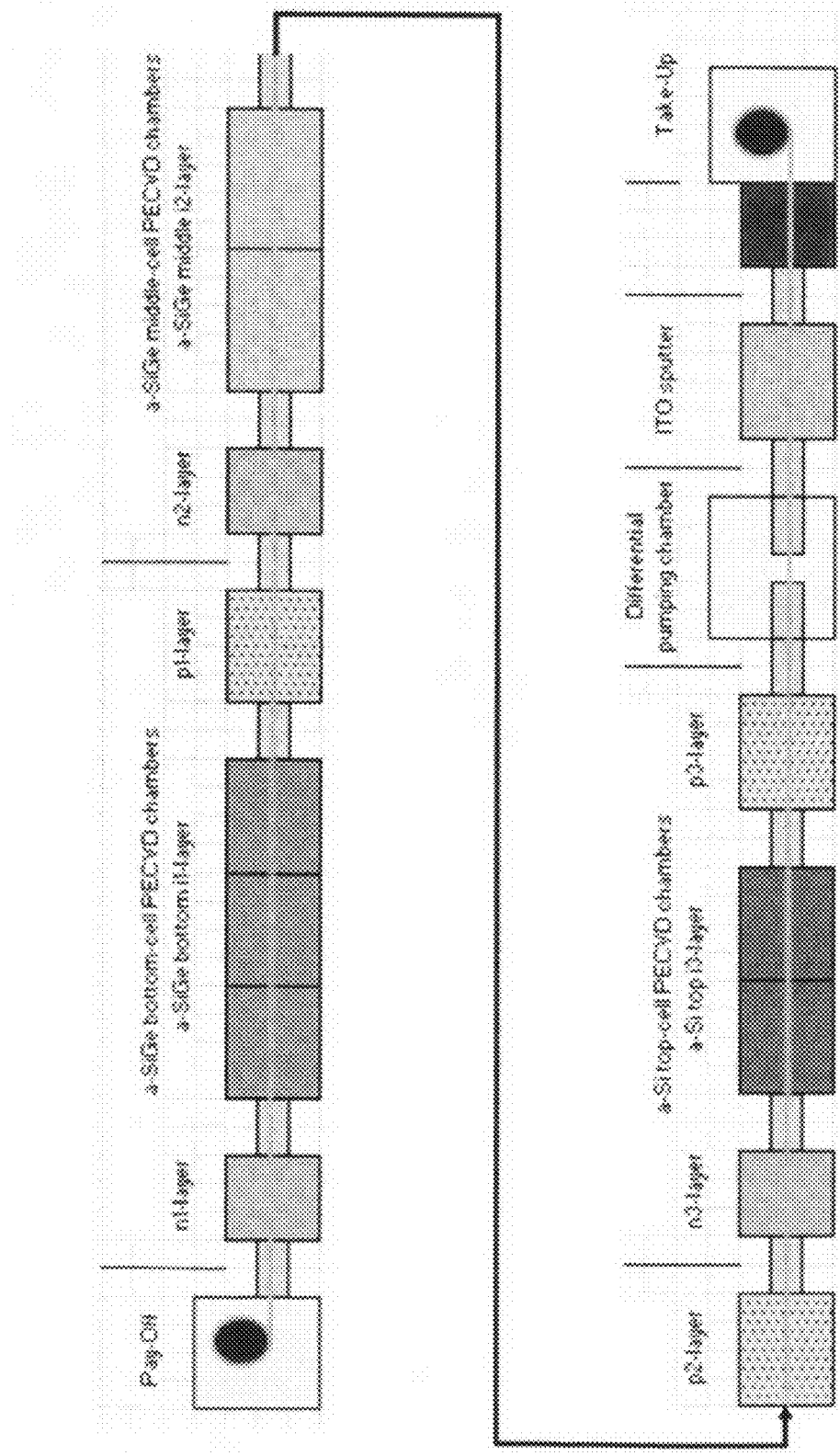
FIG. 9 is a cross-sectional side view of a silicon-PECVD/ ITO-sputter roll-to-roll production machine (illustrated in two sections, top and bottom, joined by a connector line in order to fit on page), in accordance with an embodiment of the invention.

A plurality or roll-to-roll deposition systems may be used to form the photovoltaic cell of FIG. 7. A large-scale thin-film silicon solar cell production line in the front-end facility comprises one roll-to-roll washing machine (not shown), one back reflector roll-to-roll production machine (FIG. 8) and one PECVD/ITO roll-to-roll production machine (FIG. 9). Stainless steel (SS) coils are used as substrates, which in some embodiments may have a thickness of 0.005" (0.127 mm), a minimum width of 10", a preferable width of 36", and a minimum length of 5000 ft.

In the roll-to-roll washing machine, a roll of an uncleaned SS web substrate loaded at pay-off (wind-off) chamber is guided in a roll-to-roll wet chemical cleaning process through a detergent tank, a DI water rinse tank, a blower and dry station. An oil-free, particle-free, clean SS substrate web is then wound up together with protective interleaf onto a core at the take-up (windup) chamber of the washing machine.

Next, a back-reflector is deposited on the substrates. For back-reflector deposition, a stainless steel coil of cleaned 3 ft-wide SS substrate web may be loaded into a large-scale back reflector roll-to-roll production machine (see FIG. 8) and put through the following processes: the cleaned SS web will move into metal (Al or Ag) sputtering chamber and ZnO sputtering chambers for depositing a metal reflective layer (with a minimum thickness of 100 nm) and a ZnO barrier layer (with a minimum thickness of 300 nm) respectively. The flexible SS web coils coated with Al (or Ag)/ZnO back-reflector at BR machine will be transferred to PECVD/ITO machine to serve as substrates for thin-film silicon and ITO materials deposition.

Next, the photovoltaic device structure is deposited. During thin-film silicon and ITO deposition, the BR coated SS coils are loaded into a large-scale PECVD/ITO roll-to-roll production machine, as shown in FIG. 9. The roll-to-roll production machine of FIG. 9, illustrated in two sections to fit on the page, may be a single, continuous roll-to-roll system. A substrate web will move at 4 feet (ft)/min through all thin-film silicon PECVD chambers to be deposited with ~600 nanometers (nm) 9-layer films (n1/ilpln2/i2/p2/n3/i3/p3, wherein 'n', 'p' and 'i' designate n-type, p-type and intrinsic films or thin films, respectively) of an advanced a-Si/a-SiGe/a-SiGe structure. Then the thin-film silicon coated material web will move through a differential chamber and an ITO sputtering chamber for completing ~70 nm transparent conductive ITO deposition on the top. Thus large-area (minimum 3 feet×5000 feet) flexible thin-film silicon photovoltaic (or solar cell) materials can be produced in one run using the above processes at a large-scale thin-film silicon solar cell production line, having a minimum initial dot-cell efficiency of about 10% (Voc of about 2.15 V, Jsc of about 7.5 mA/cm2, and an FF of about 62%), and a minimum yield of about 90%. The differential pumping chamber can be the DPIU 500 of FIG. 6.

Example 3

Figure 10:
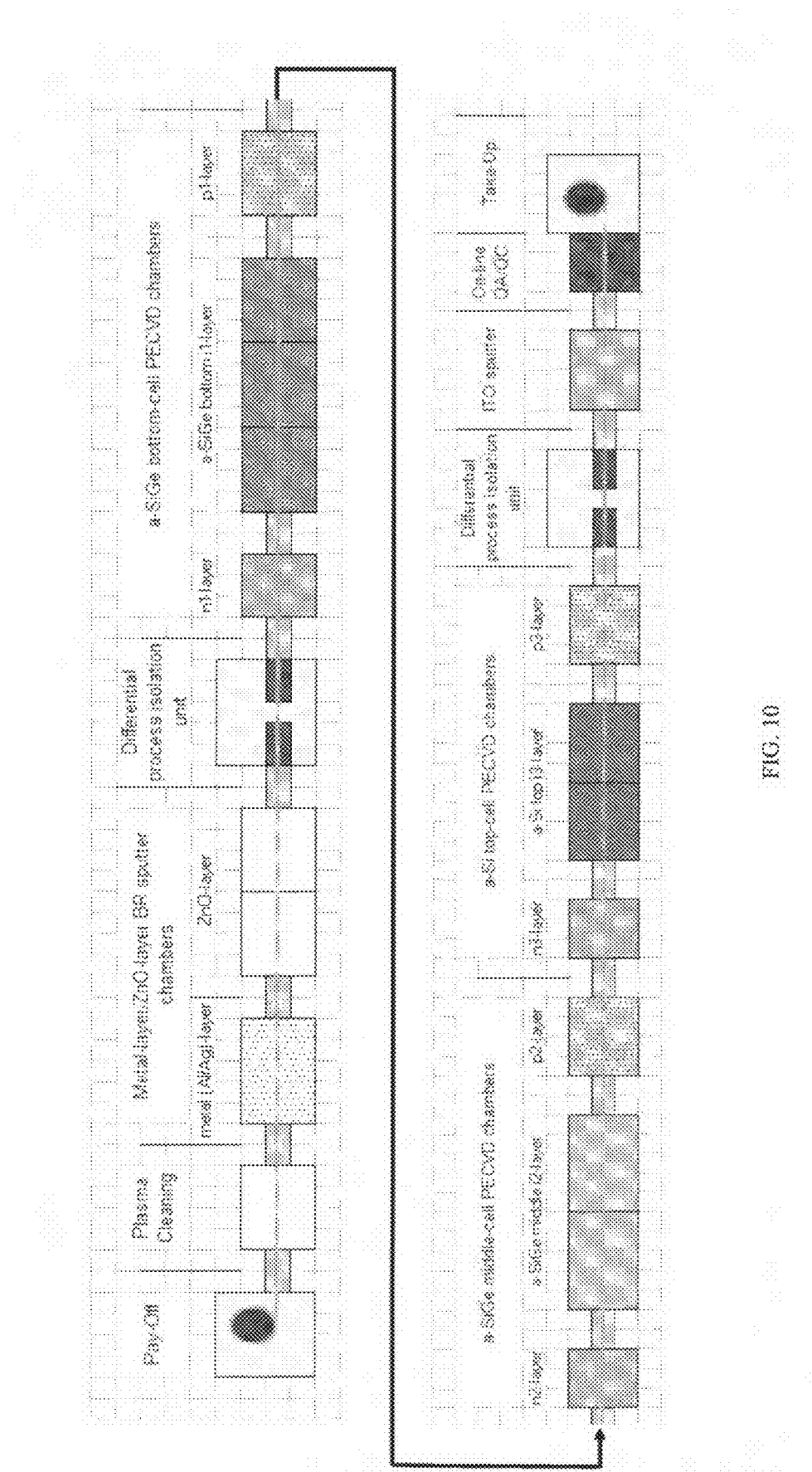
FIG. 10 is a cross-sectional side view of a plasma-cleaning/ BR-sputter|silicon-PECVD/ITO-sputter roll-to-roll production machine (illustrated in two sections, top and bottom, joined by a connector line in order to fit on page), in accordance with an embodiment of the invention; and invention.

With reference to FIG. 10, a vacuum roll-to-roll thin-film production machine may be used to form the photovoltaic cell of FIG. 7. The roll-to-roll production machine, illustrated in two sections to fit on the page, may be a single, continuous, roll-to-roll system. A large-scale thin-film silicon solar cell roll-to-roll production machine in the front-end facility comprises a substrate payout chamber, a plasma cleaning chamber, a back-reflector sputtering deposition chamber, a thin film silicon PECVD deposition chamber, a transparent conductor deposition chamber, and a substrate take up chamber. A differential process isolation unit (DPIU) is disposed between the back-reflector deposition chamber and the PECVD chamber. A second DPIU is disposed between the PECVD chamber and the transparent conductor deposition chamber. Stainless steel (SS) coils are used as substrates, which have a thickness of about 0.005" (0.127 mm), a minimum width of about 10", a preferable width of about 36", and a minimum length of about 5000 ft.

In the plasma cleaning chamber, an Ar or Ar/$O_2$-containing plasma at a pressure of about 0.01 Torr is used to clean the SS substrate.

Next, a metal-layer/ZnO-layer back-reflector (BR) is deposited at about 5 mTorr by Ar sputtering on the substrate. Metal (Al or Ag) and ZnO are deposited with minimum thicknesses of about 100 run and about 300 run, respectively. The flexible SS web coils coated with an Al (or Ag)/ZnO back-reflector moves through a differential process isolation unit (DPIU) into thin-film silicon PECVD deposition chambers operating at pressures between about 0.5 Torr and 5 Torr. The DPIU is fed with Ar sweep gas on the BR side and H2 sweep gas on the PECVD side. Then, the thin-film silicon coated material web, which has a SSIBR/a-SiGe/a-SiGe/a-Si multi-layer structure, moves through a second DPIU to an ITO sputtering chamber for completing the deposition of an ITO transparent conductive layer on top, the ITO transparent conductive layer having a thickness of about 70 run. The second DPIU is fed with H2 sweep gas on the PECVD side and Ar sweep gas on the ITO side. Thus, large-area (minimum of about 3 feet×5000 feet) flexible thin-film silicon photovoltaic (or solar cell) materials can be produced in a single machine using the above processes at a large-scale thin-film silicon solar cell production line, having a minimum initial dot-cell efficiency of about 10% (Voc of about 2.15 V, Jsc of about 7.5 mAlcmz, and a fill factor (FF) of about 62%), and a minimum yield of about 90%. The DPIU can be the system 500 of FIG. 6.

Example 4

Figure 11:
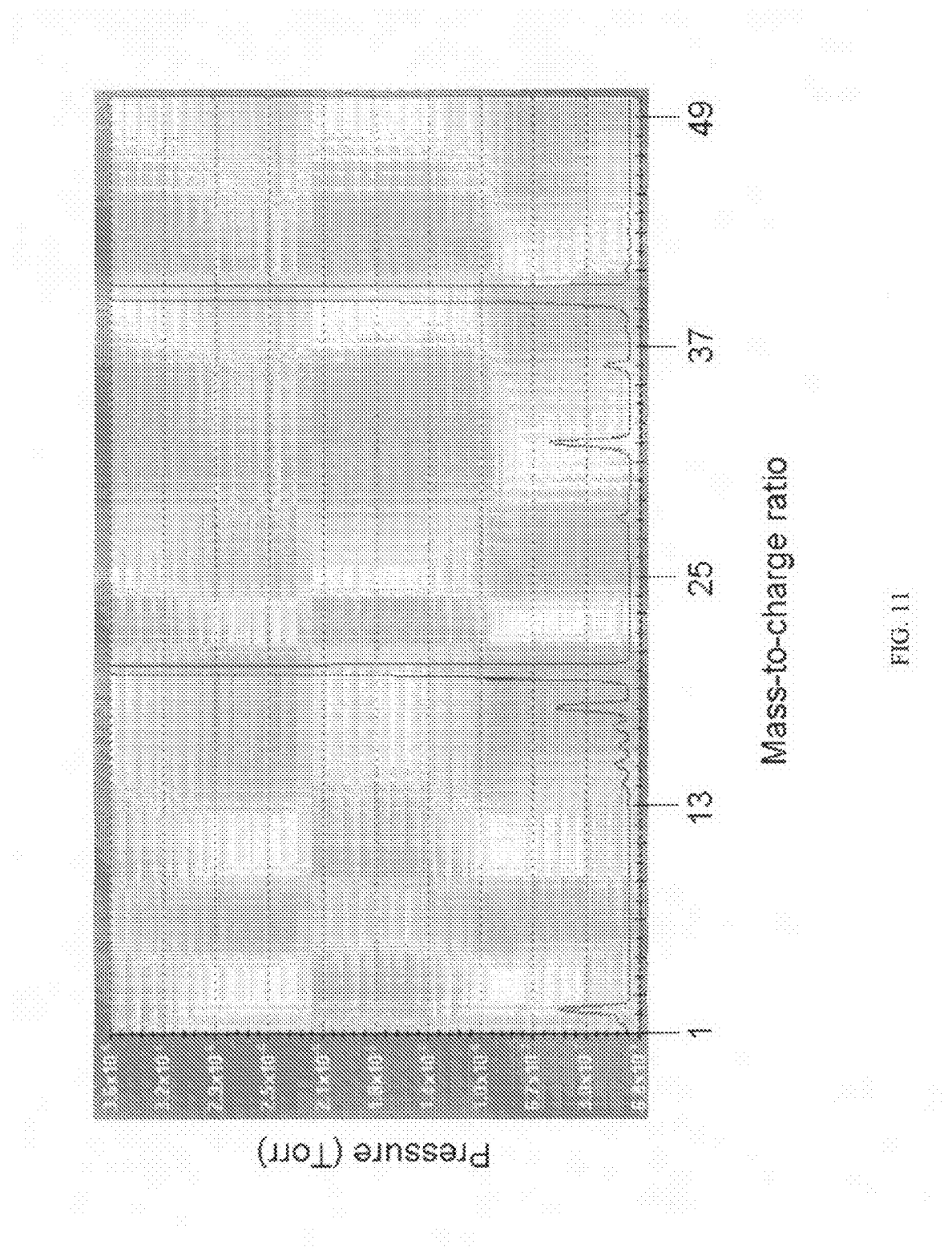
FIG. 11 is a residual gas analyzer (RGA) plot, in accordance with an embodiment of the invention.
Figure 12:
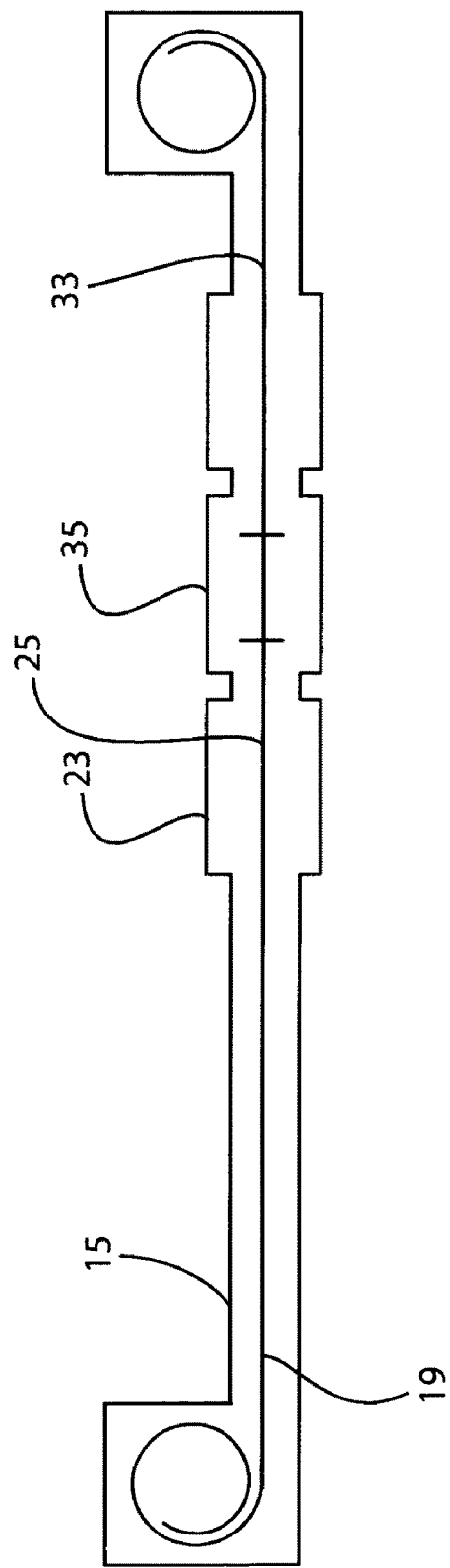
FIG. 12 is a side elevation view of the invention.
Figure 17:
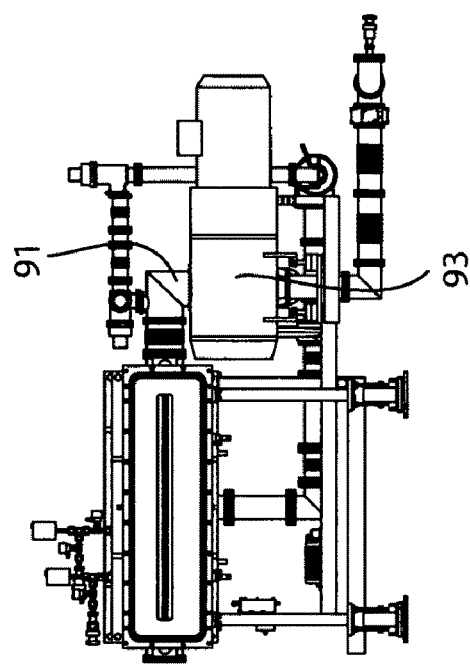
FIG. 17 is an end view of the isolation chamber.
Figure 16:
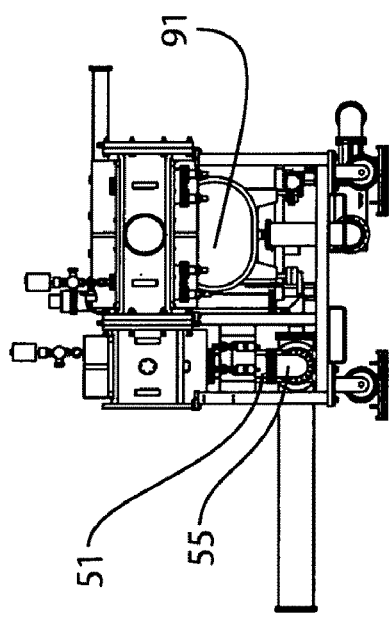
FIG. 16 is a cross sectional view of the isolation chamber.
Figure 18:
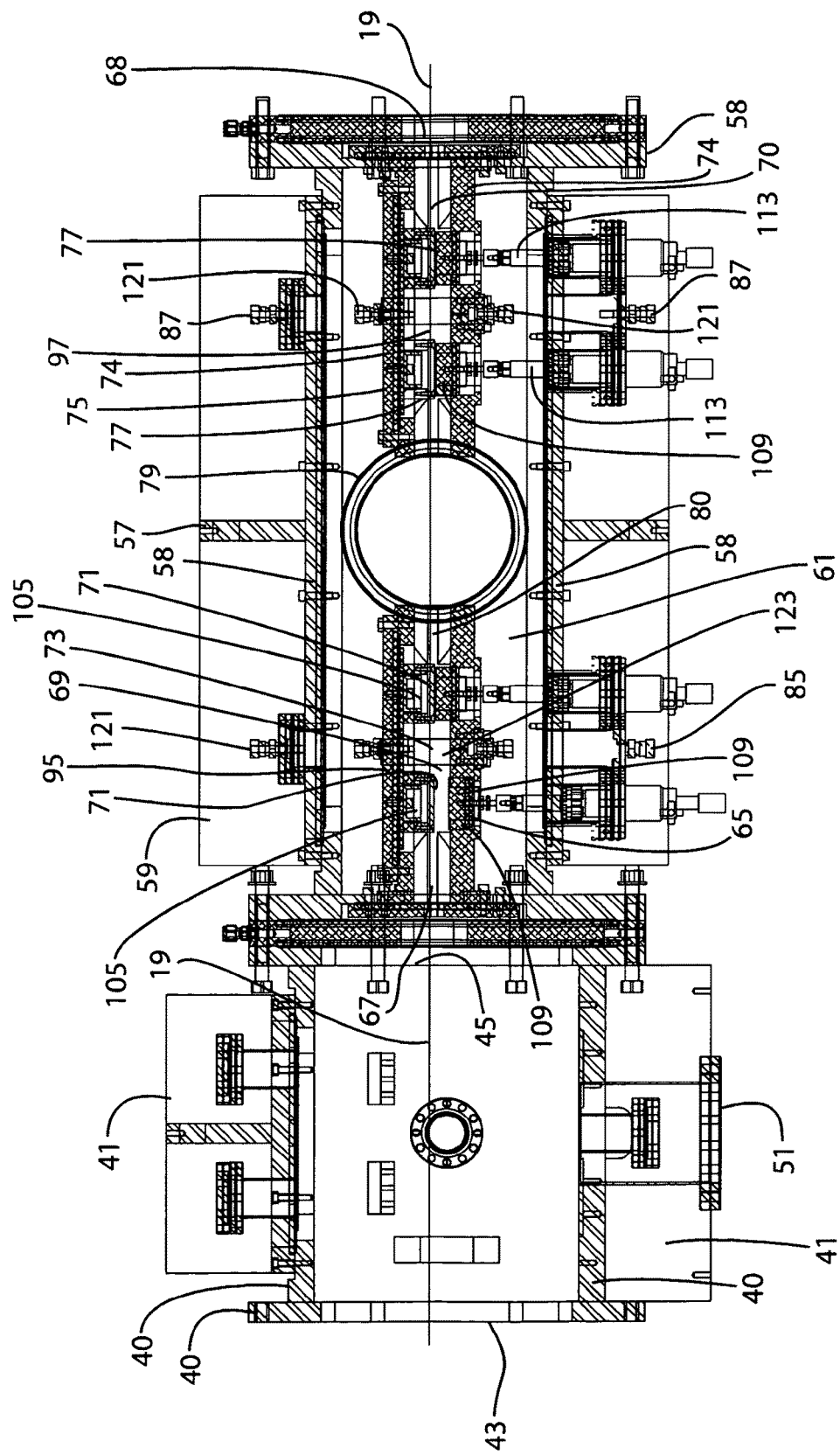
FIG. 18 is a cross sectional view.

A thin-film silicon PECVD chamber is filled with $H_2$ gas at a flow rate of about 12000 sccm and a pressure of about 1.0 Torr. An ITO sputtering chamber is filled with Ar gas at a flow rate of about 1000 sccm and $O_2$ gas at a flow rate of about 5 sccm. The PECVD chamber and the ITO sputtering chamber are adjacent a DPIU, such as the DPIU 500 of FIG. 6. A sweep gas flow 505 comprising $H_2$ gas at a flow rate of about 4000 sccm is admitted into the PIU 501. A sweep gas flow 506 comprising Ar gas at a flow rate of about 5000 sccm is admitted into PIU 502. The evacuation space 503 has a pressure of about 60 mTorr. The ITO sputtering chamber (e.g., chamber 508 of FIG. 6) has a pressure of about 4 mTorr. With reference to FIG. 11, residential (or residual) gas analyzer (RGA) peaks for $H_2$, $O_2$, Ar gases detected at the ITO sputtering gave an $H_2$/Ar ratio of about 0.42% and an $O_2$/Ar ratio of about 0.55%. A high-quality ITO film was produced on thin-film silicon in roll-to-roll mode based on above process parameters.

As is known in the art, the components used in the back reflector deposition zone, the semiconductor deposition zone, and the transparent conductive oxide deposition zones are not compatible and any contamination of components between these two deposition zones will significantly decrease the quality of the finished solar cell material. Accordingly, there is a need for an isolation chamber that can effectively eliminate cross contamination between deposition zones for an in-line continuous solar cell material fabrication process. In addition, there is a need for an isolation chamber that can effectively separate deposition zones having significantly different environmental conditions in the respective zones.

The invention is directed to an isolation chamber that is used in the production of solar cell material. More particularly, the isolation chamber is used to separate deposition zones on a continuous process for forming solar cell material. The isolation chamber can separate deposition zones that have significant differences in operating pressures while substantially eliminating any cross contamination between the deposition zones. The features of the invention will be more readily understood by referring to the attached drawings in connection with the following description.

As shown in FIGS. 12-18 the isolation or differential chamber is used in a solar cell production facility to separate various deposition zones where components of the solar cell are deposited on a substrate. There can be several deposition zones in a solar cell production facility. It should be understood, however, that the isolation chamber can be utilized just as effectively with other deposition zones for forming a solar cell material and components. The isolation chamber can also be used to separate the back reflector zone and plasma cleaning zones that are used in the production of solar material. To facilitate the explanation of the invention a semiconductor deposition zone and a conductive material deposition zone will be used as an example. The first and second insert chambers 73, 75 for the semiconductor deposition and conductive material deposition examples are at a pressure that is less than 100 Torr but large than or equivalent to the pressure in the interior 61 of the second chamber 59. The interior 61 generally has a pressure in the range of 1 mTorr to 20 Torr. The walls 58 of the second chamber accommodate the large pressure differential between the interior 61 of the second chamber and the atmosphere that surrounds the second chamber. The first and second insert chamber 73, 75 have less pressure differential with the interior 61 than between the interior 61 and the atmosphere outside of the second chamber 59. The combination of the outer wall 58 of the second chamber and the outer walls 74 of the first and second insert chambers allow large pressure differential to be accommodated without compromising the efficiency of the solar cell process. The outer walls 58 of the second chamber 59 and the outer wall 74 of the first and second insert chambers protect the insert chambers from atmospheric pressure and allow the differential inserts to hold the web in a planar orientation during the processing of the solar material. The solar cell production operation has a plurality of components that are positioned in adjacent relationship and form an enclosed chamber 15 through which a substrate 19 is advanced. The substrate is disposed for receiving the solar cell material. At least one semiconductor deposition zone 23 is part of the enclosed chamber 15. The semiconductor deposition zone is disposed for applying a semiconductor material 25 to the moving substrate. The semiconductor material can be applied using various deposition methods, but it has been found to be particularly effective to utilize plasma enhanced chemical vapor deposition to deposit the semiconductor material on the moving substrate. In the deposition of the semiconductor material there is a small portion of the material that is not deposited on the substrate. Such unreacted gases are volatile materials that can leave the semiconductor deposition zone and contaminate other deposition zones or processing zones. The application of the semiconductor material 25 in the semiconductor deposition zone 23 creates a pressure from about 0.1 Torr to about 20 Torr in the semiconductor deposition zone 23.

At least one conductive material deposition zone 31 is part of the enclosed chamber 15. The conductive material deposition zone is disposed for applying a transparent conductive oxide layer 33 on the surface of the semiconductor material that is spaced apart from the substrate. As the transparent conductive oxide layer is placed on the semiconductor material the conductive material deposition zone is located in the enclosed chamber at a location after the semiconductor deposition zone. The transparent conductive oxide layer 33 can be applied by various application techniques, but it has been found particularly advantageous to apply this layer by a sputtering process. In the deposition of the conductive material there is a small portion of the material that is not deposited on the semiconductor material. Such unreacted gases are volatile materials that can leave the conductive material deposition zone and contaminate the deposition zone. The application of the transparent conductive oxide layer creates a pressure in the conductive material deposition zone. The pressure in the conductive material deposition zone is from about 0.001 Torr to about 0.020 Torr and is from about 20% to about 0.01% of the pressure in the semiconductor deposition zone where the semiconductor material is deposited. The pressure differential between the semiconductor deposition zone and the conductive material deposition zone can create process difficulties as any volatile materials in the semiconductor deposition zone are normally drawn to the lower pressure conductive material deposition zone. Although the general flow of any volatile materials is from the high pressure semiconductor deposition zone to the lower pressure conductive material deposition zone, it should be appreciated that it is also possible for volatile materials in the conductive material deposition zone to migrate to the semiconductor deposition zone. The components used in the semiconductor deposition zone 23 to apply the semiconductor material and the components used in the conductive material deposition zone 31 to apply the transparent conductive oxide layer are not compatible and the migration of volatile components to a different deposition zone contaminates the deposition process and insignificantly reduces the quality of the solar cell material that is produced. Although specific pressure ranges have been recited for the semiconductor and conductive material deposition zone, it should be appreciated that such pressures can vary based on process parameters used to form the solar cell material. Also other deposition zones may have different pressure ranges. A consideration is thus that there is a pressure differential between deposition zones that need to be isolated. Accordingly, it is particularly important to functionally separate the semiconductor deposition zone 23 from the conductive material deposition zone 31 to prevent any cross contamination between these deposition zones.

To accomplish the separation of various deposition zones, and as used for explanation purposes, the semiconductor deposition zone 23 from the conductive material deposition zone 31, an isolation chamber 35 is part of the enclosed chamber 15. The isolation chamber is positioned between the at least one deposition zone and the at least one conductive material deposition zone. The isolation chamber 35 has a first chamber 39 for receiving the substrate or semiconductor material coated substrate and unreacted volatiles from the semiconductor deposition zone 23. The first chamber has an entrance aperture 43 and an exit aperture 45 to allow the substrate and semiconductor material to be advanced through the first chamber 35. The entrance and exit apertures have an opening that is greater in height than the thickness of the substrate and semiconductor material to allow the substrate and semiconductor material to move through the chamber. The first chamber 39 has outer walls 40 formed of a strong material such as stainless steel sheet. Reinforcing ribs 41 can be positioned along at least a portion of the outer walls 40 and the ribs are usually made of the same material as the outer walls 40. The outer walls need to have sufficient strength to accommodate the pressure differential between the exterior of the first chamber and the interior 47 of the first chamber. As the exterior is at substantially atmospheric pressure and the interior 47 is at a substantially reduced pressure, considerable force can be placed on the walls 40 of the first chamber. An opening 51 is provided on the first chamber 39 and the opening is in communication with the interior 47 of the first chamber. A source of vacuum 55 is connected to the opening 51 on the first chamber 39. The source of vacuum is provided for evacuating the first chamber to withdraw unreacted volatiles, from the deposition zone 23 where the semiconductor material is deposited, from the interior 47 of the first chamber 39. It is important that the pressure drop from the semiconductor deposition zone 23 to the first chamber 39 of the isolation chamber 35 not be more than from about 10% to about 95% and in a preferred range from about 30% to about 70% of the pressure in the semiconductor deposition zone. If the pressure drop is too large, the reduced pressure zone in the first chamber 39 may impact the reaction gases used in the semiconductor deposition zone and reduce the deposition rate of the semiconductor material.

The isolation chamber 35 has a second chamber 59 for receiving the substrate and semiconductor material from the exit aperture 45 of the first chamber 39. The second chamber 59 is positioned adjacent to the first chamber. The second chamber 59 has outer walls 58 that are formed of a strong material such as steel sheet. Reinforcing ribs 57 can be positioned on at least some of the outer walls to further reinforce the outer walls 58. The outer walls 58 need to be strong to accommodate pressure differentials between the atmospheric pressure on the exterior of the second chamber and the reduced pressure on the interior 61 of the second chamber as previously described with respect to the first chamber 39. The second chamber has an entry slot 67 that is in alignment with the exit aperture 45 of the first chamber 39, for receiving the web of the substrate and semiconductor material. The second chamber has an exit slot 68 position on the opposite end of the second chamber. A first insert chamber 73 and a second insert chamber 75 are positioned in the interior 61 of the second chamber 59. The first insert chamber 73 is in communication with the entry slot 67 and the second insert chamber 75 is in communication with the exit slot 68. The end of the first insert chamber 73 that is spaced apart from the entry slot 67 and the end of the second insert chamber 75 that is spaced apart from the exit slot 68 are in communication with pumping port 79. A port passageway 80 is located on the end of the first and second insert chambers that are in communication with the pump ports 79. The outer walls 74 of the first and second insert chambers are made from a strong material such as steel sheet to accommodate pressure differentials between the interior 61 of the second chamber 59 and the interior of the first and second insert chambers. The first and second insert chambers 73, 75 are at a pressure that is less than 100 Torr but large than or equivalent to the pressure in the interior 61 of the second chamber 59. The interior 61 generally has a pressure in the range of 1 mTorr to 20 Torr. The walls 58 of the second chamber accommodate the large pressure differential between the interior 61 of the second chamber and the atmosphere that surrounds the second chamber. The first and second insert chamber 73, 75 have less pressure differential with the interior 61 than between the interior 61 and the atmosphere outside of the second chamber 59. The combination of the outer wall 58 of the second chamber and the outer walls 74 of the first and second insert chambers allow large pressure differential to be accommodated without compromising the efficiency of the solar cell process. The outer walls 58 of the second chamber 59 and the outer wall 74 of the first and second insert chambers protect the insert chambers from atmospheric pressure and allow the differential inserts to hold the web in a planar orientation during the processing of the solar material. The isolation chamber can also be used to separate the back reflector zone and plasma cleaning zones that are used in the production of solar material. The isolation chamber can also be used to separate the back reflector zone and the plasma cleaning zones that are used in the production of solar material. The pressure differentials and atmospheric conditions would be different for these zones than the examples previously cited. The isolation chamber would, however, function in the same manner to accommodate the pressure and atmosphere differences between such zones.

A first pair of differential inserts 65 is positioned in the first insert chamber 73 of the second chamber 59. The first pair of differential inserts 65 have a first insert located adjacent the entry slot 67 and a second insert located adjacent the pumping port 79. The first insert defines an insert slot 69. The insert slot 69 functions to restrict the volatile materials from the semiconductor deposition zone 23 from entering the interior of the first insert chamber 73. The first pair of differential inserts have at least one side 71 made of a low friction material such as Teflon. The low friction material is disposed to engage the side of the substrate 19 that is spaced apart from the semiconductor material 25. The at least one side 71 of low friction material acts to hold the substrate and semiconductor material in a very straight orientation as the substrate and semiconductor material passes through the second chamber 59. A magnetic bar 105 can be positioned on the low friction side 71 that is spaced apart from the substrate 19. The magnetic bar 105 can be used if a portion of the substrate is magnetic wherein the magnetic bar will function to pull the substrate into contact with the low friction side of differential inserts. The other side of the first pair of differential inserts 65 has an adjustable block 109 that is moveably mounted on an adjustment device 113. The adjustment device can be activated to move the adjustment block 109 with respect to the substrate 19 and semiconductor material 25. The insert slot 69 is formed by the low friction side 71 and the adjustment block 109. The low friction side 71 is disposed to engage the substrate and the adjustment block is spaced from about 0.1 mm to about 5 mm and in a preferred range from about 0.5 mm to about 3 mm from the semiconductor material deposited on the substrate. The adjustment block 109 on each isolation insert can be moved independently with respect to the substrate and semiconductor material. If the spacing is adequately defined it may not be necessary to have the adjustment blocks moveably unlimited on an adjustment device.

A second pair of differential inserts 77 is positioned in the second insert chamber 75. The second pair of differential inserts 77 has the same structure and function in the same manner as the first pair of differential inserts 65. The second pair of differential inserts has a first insert located adjacent the exit slot 68 and a second insert located adjacent the pump port 79. The first insert defines a differential slot 70 for the web formed of the substrate and semiconductor material. The differential slot 70 functions to restrict the flow of volatile materials from the conductive materials deposition zone 31 to the second chamber 59 and from the second chamber 59 to the conductive material deposition zone.

At least one supply port 85 is position on the second chamber 59 and in communication with the interior of the first insert chamber 73. The at least one supply port 85 is in communication with the interior of the first insert chamber 59 in the area between the first pair of differential inserts 65. At least one supply passageway 87 is positioned on the second chamber 59 and in communication with the interior of the second insert chamber. The at least one supply passageway 87 is in communication with the interior of the second insert chamber between the second pair of differential inserts 77. An inert gas source 89 is connected to the at least one supply ports 85 and at least one supply passageway 87 on the second chamber. A nozzle 121 is positioned between the first pair differential inserts on each side of the passageway 123 formed for the substrate and semiconductor material. The nozzles 121 are connected to the inert gas source and supply an inert gas to each side of the solar cell material passing through the second chamber 59. A pair of nozzles 121 are positioned between the second pair of differential inserts 77 are connected to the inert gas source and supply an inert gas to the region of the second chamber 59 in the same manner as previously described. An opening 91 is located on the second chamber 59 and connected to pumping port 79. A source of vacuum 93 is connected to the opening 91. The source of vacuum 93 is provided for evacuating the pumping port in the second chamber 59 to draw from the first and second insert chambers volatiles from the semiconductor deposition zone 23 and volatiles from the conductive material deposition zone 31. The source of vacuum also acts to draw the inert gas provided by the at least one supply ports 87, and at least one supply passageway 89 that supply inert gas to the first and second insert chamber. The first pair of differential inserts 65 form a first pressure zone 95 in the first insert chamber 73 and the second pair of differential inserts 77 forms a second pressure zone 97 in the second insert chamber 75. The first chamber 39 and the second chamber 59 of the isolation chamber 35 effectively restrict the transfer of volatile materials from the semiconductor deposition zone and the conductive material deposition zone of an in-line process for forming the solar cell material. This function of the isolation chamber 35 effectively eliminates contamination of the solar cell material during the in-line formation of the solar cell material.

Although the isolation chamber 35 has been described as having two insert chambers 73 and 75 and a first and second pair of differential inserts 65, 77, it should be appreciated that depending on process parameters, only one insert chamber and only one pair of differential inserts maybe adequate. Conversely, process parameters may require that more than two insert chambers and more than two pairs of differential inserts be used to control the pressure and atmospheric differences between various process zones. In addition, the introduction of the inert gas can be modified to suit operational conditions.

In operation the web comprised of the substrate 19 and the semiconductor material 25 advances from the semiconductor deposition zone 23 to the first chamber 39 of the isolation chamber 35. There may be unreacted volatiles from the semiconductor deposition zone that moves with the web into the first chamber 35. As the first chamber 35 is connected to a source of vacuum 55 through opening 51 a significant portion of any such volatiles will be drawn from the interior 47 of the first chamber 39 through the opening 51. In addition, the source of vacuum connected to the opening 51 will cause some of the inert gas supplied to the first insert chamber 73 in the second chamber 59 to be drawn through the first insert, through the entry slot 67 and into the interior 47 of the first chamber 39. The inert gas that enters the first chamber 39 is then exhausted through opening 51 by the source of vacuum connected to the opening. This flow for the inert gas further acts as an impediment to the movement of any volatiles from the semiconductor deposition zone 23 from the first chamber 39. The web of the substrate and semiconductor material that enters the first chamber 39 is at a pressure that is higher than the pressure in the interior 47 of the first chamber 39. Accordingly, the pressure experienced by the web of the substrate and semiconductor material is significantly reduced as the web passes through the first chamber 39. It is important that the pressure reduction achieved in the first chamber 39 not be too great as a large pressure differential may encourage the migration of unreacted volatiles from the semiconductor deposition zone 23 to the first chamber 39. As it is the objective of the isolation device to remove any such unreacted volatiles from advancing along the process line it is important not to increase the transfer of such unreacted volatiles from the semiconductor deposition zone. It is been found that a significant portion of the unreacted volatiles that migrate from the semiconductor deposition zone 23 are removed in the first chamber 39. Normally from about 50% to about 90% of the unreacted volatiles that advance from the semiconductor deposition zone are removed in the first chamber 39. As the web of the substrate and semiconductor material leaves the first chamber 39 it enters the entry slot 67 where inert gas from the first insert chamber 73 flows against the direction of travel of the web into the first chamber 39 and further restricts the migration of any volatiles along the path of advancement of the web. In the first insert chamber 73 the at least one side 71 of the first differential insert 65 is disposed to engage the surface of the substrate that is spaced apart from the semiconductor material. As the at least one side is formed of a low friction material such as Teflon the substrate will slide along this side of the first differential insert. The low friction side of the first insert engages the web in such a manner that the web is held in a very straight and flat orientation. The adjustable block 109 of the first differential insert is caused to advance toward the semiconductor material 25 on the web by the adjustment device 113. The adjustable block 109 is advanced until it is in very close proximity to the semiconductor material. The close proximity between the low friction side 71 and the adjustable block 109 forms a very restrictive passageway that inhibits the migration of any unreacted volatiles past the first differential insert 65. In addition, the inert gas introduced into the first insert chamber 73 flows through the opening formed between the low friction side 71 and the adjustable block 109 as it is drawn into the first chamber 39 by the source of vacuum 55.

The web of the substrate and semiconductor material advances to the second differential insert 65 in the first chamber 73 and passes between the low friction side 71 and the adjustable block 109. The space between the low friction side 71 and the adjustable block 109 is usually the same as or larger than the space between the low friction side and adjustable block on the first differential insert 65. Inert gas that is introduced into the first chamber 73 advances through the opening between the low friction side 71 and the adjustable block 109 on the second differential insert in the first insert chamber 73. The inert gas is drawn into the pumping port 80 which is connected to a source of vacuum 93 through opening 91. The source of vacuum draws the inert gas and any unreacted volatiles from the semiconductor deposition zone into the pumping port and away from the further processing of the web. In practice it has been found that substantially all of the unreacted volatiles from the semiconductor deposition zone 23 are removed by the time the web enters the pumping port 79. From the pumping port 79 the web enters the second insert chamber 75 and passes through the second differential insert in the second insert chamber. The low friction surface 71 and the adjustable block 109 forms a passageway for the web in the manner previously described with respect to the first insert chamber. As the web moves through this passageway inert gas that is introduced into the second insert chamber 75 is drawn across the web in a direction opposite to the direction of the advancement of the web and into the pumping port 79. This movement of the inert gas further reduces the likelihood that any unreacted volatiles from the semiconductor deposition zone 23 will advance beyond the first differential insert in the second insert chamber 75. As the web advances through the second insert chamber 75 the first differential insert 65 in the second insert chamber defines a passageway between the low friction side 71 and the adjustable block 109 in the manner previously described. The passageway is designed to be in close proximity to the advancing web. Essentially the passageway defined by the first differential insert in the second insert chamber 75 will have the same spacing as the first differential insert 65 in the first insert chamber 73. As the web of the substrate and semiconductor material advances past the first differential insert in the second insert chamber 75 it passes into the conductive material deposition zone 31 where a conductive material is deposited on the semiconductor material. The close proximity of the first differential insert in the second insert chamber 75 acts to restrict the movement of any unreacted volatiles from the semiconductor deposition zone 23 past the first differential insert 65 in the second insert chamber 75. At the same time the close spacing for the passageway formed by the first differential insert in the second insert chamber forms a barrier to the movement of any unreacted volatiles from the conductive material deposition zone 31 in a direction towards the second insert chamber 75. In addition, the inert gas introduced into the second insert chamber 75 is drawn through the passageway formed by the first differential insert 65 in the second chamber 75 as the conductive material deposition zone is at a lower pressure than the second insert chamber. This flow for the inert gas further inhibits the migration of any unreacted volatiles from the conductive material deposition zone. In the unlikely event that any unreacted volatiles from the conductive material deposition zone 31 migrate past the first differential insert 65 in the second insert chamber 75 such volatiles will be drawn past the second differential insert 65 in the second insert chamber 75 and into the pumping port 79 and removed from the process that forms the solar cell material.

The web that exits the second insert chamber 75 will contain essentially no unreacted volatiles from the semiconductor deposition zone 23. Any such unreacted volatiles from the semiconductor deposition zone that might advance beyond the second insert chamber 75 will be so minute that they will have very little impact on the deposition of the conductive material in the conductive material deposition zone 31. As the flow of most unreacted volatiles is from a high pressure zone to a lower pressure zone there usually not much flow of unreacted volatiles from the conductive material deposition zone in a direction towards a semiconductor deposition zone 23. If such migration does take place, however, the second insert chamber 75 and the pumping port 79 will function to essentially remove any such unreacted volatiles from the conductive material deposition zone 31.

The isolation chamber of the present invention can be utilized between any deposition zones that are present in the formation of solar cell material. The isolation chamber 35 can accommodate significant pressure differentials in the respective deposition zones and provides a great deal of flexibility to accommodate the different characteristics of such deposition zones. The positioning of the low friction side 71 and the adjustable block 109 on the differential insert 65 can be adjusted to control the pressure drop and flow of inert gases to accommodate various deposition processes. In addition, the source of vacuum supplied to the first chamber 39 and the pumping port 79 of the second chamber 59 can be varied to control the flow of inert gases and the pressure drop created by the first chamber 39 and the second chamber 59. This flexibility makes the isolation chamber particularly well suited for the production of solar cell materials where the parameters in the deposition zones vary and require adjustment of the processing parameters to produce solar material of the highest quality.

It should also be appreciated that isolation chambers can be positioned in adjacent relationship and accommodate larger pressure drops in the various areas that are used to form a solar cell material.

As known to those skilled in the art, solar cell material is especially sensitive to environmental conditions such as humidity. Furthermore, as noted above, the additional handling of solar cell material can result in the creation of defects in the solar cell material. For instance, when transferring the solar cell material that does not have a conductive material layer deposited thereover, the solar cell material can be scratched. This is especially problematic in a roll-to-roll process where when winding the web in a take-up chamber the uncoated surface of the web may contact the solar cell material deposited on the coated surface. Thus, the present invention also provides a method for producing high yield solar cell material.

The method includes providing a single machine which permits the deposition of a semiconductor material over a substrate, preferably a moving metal substrate, and the deposition of a conductive material layer over the substrate, preferably a moving metal substrate. In an embodiment, within the single machine of the present invention a layer of conductive material is deposited over the solar cell material. Thus, the single machine comprises at least one solar cell deposition chamber, the isolation chamber, and at least one conductive layer material deposition chamber.

In an embodiment, the single machine also permits the deposition of additional layers of solar cell material and conductive material. For example, an amorphous silicon triple junction solar cell can be deposited with the single machine of the present invention. Additionally, in another embodiment the single machines of the present invention allows conductive layers to be deposited before depositing the solar cell material. For instance, in an embodiment, a back reflector layer may be formed from a metal or metal alloy such as aluminum or an aluminum alloy. In this embodiment, the back reflector layer may be deposited before depositing the solar cell material. In another embodiment, a conductive barrier layer material may be deposited before depositing the solar cell material. In this embodiment the conductive barrier layer material may be ZnO:A1.

The method further includes removing the substrate from the single machine, wherein the substrate has a least one layer of a solar cell material and at least one conductive layer deposited above the substrate. In an embodiment, the substrate is a metal web. In another embodiment, the substrate has been wound into coil as known in the roll-to-roll process of solar cell manufacturing.

The method further includes preventing debris, humidity, or atmospheric gases from contacting the solar cell material.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

We claim:

1. An isolation chamber for use in separating adjacent deposition zones used in the production of solar cell material where the deposition zones are at different pressures, the isolation chamber substantially eliminating cross contamination by volatiles from adjacent deposition zones, a substrate being advanced through the deposition zones for receiving the solar cell material, the isolation chamber comprising:
   a first chamber for receiving the substrate; the substrate being at a first pressure in the first chamber;
   a source of vacuum being connected to the first chamber, the source of vacuum acting to withdraw volatiles from the first chamber,
   a second chamber positioned adjacent the first chamber for receiving the substrate, the substrate entering the second chamber at substantially the pressure at which the web leaves the first chamber;
   at least one differential insert positioned in the second chamber, the at least one differential insert having a first side made of a low friction material, the low friction material first side being disposed to engage the substrate; the second side of the at least one differential inserts being an adjustable block, the adjustable block being disposed adjacent the web, the at least one differential insert defining a slot, the slot functioning to restrict the unreacted volatiles from the first chamber from entering the second chamber;
   a source of vacuum being connected to the second chamber, the source of vacuum acting to withdraw unreacted volatiles from the second chamber, the source of vacuum reducing the pressure in the second chamber from the pressure in the first chamber.

2. The isolation chamber of claim 1 wherein an inert gas is supplied to the second chamber, the inert gas being drawn through the slot defined by the at least one differential insert into the first chamber by the source of vacuum connected to the first chamber and being drawn from the second chamber by the source of vacuum connected to the second chamber, the inert gas acting to remove unreacted volatiles from the second chamber.

3. The isolation chamber of claim 1 wherein the production of solar cell material is done in an enclosed chamber.

4. The isolation chamber of claim 3 wherein a semiconductor deposition zone for applying the semiconductor material to the moving substrate is located in the enclosed chamber adjacent the first chamber, the semiconductor material being applied by a plasma enhanced chemical vapor deposition; the semiconductor material in the semiconductor deposition zone being at a pressure from about 0.1 Torr to about 20 Torr.

5. The isolation chamber of claim 4 wherein a conductive material deposition zone located in the enclosed chamber adjacent the second chamber, the conduct material deposition zone is disposed for applying a transparent conductive oxide layer on the surface of the semiconductor material that is spaced apart from the substrate, the transparent conductive oxide being applied by sputtering; the transparent conductive oxide being applied in the conductive material deposition zone at a pressure from about 0.001 Torr to about 0.02 Torr.

6. The isolation chamber of claim 5 wherein the second chamber has a first insert chamber for receiving the substrate and semiconductor material from the semiconductor deposition zone, the first insert chamber having an aperture for receiving the substrate and semiconductor material, the aperture restricting the flow of volatile materials from the semiconductor deposition zone to the first chamber, the second chamber having a second insert chamber for receiving the substrate and semiconductor material, the second insert chamber being positioned adjacent the first insert chamber.

7. The isolation chamber of claim 6 wherein a first pair of differential inserts positioned in the first insert chamber, the first pair of differential inserts defining an entry slot for receiving the substrate and semiconductor material, the entry slot having a side that is spaced from about 0.1 mm to about 5 mm from the semiconductor material, the entry slot functioning to restrict the flow of volatile materials from the semiconductor deposition zone to the second chamber, the first pair of differential inserts having at least one side made of a low friction material that engages the substrate to straighten the substrate as it passes through the second chamber.

8. The isolation chamber of claim 7 wherein a second pair of differential inserts positioned in the second insert chamber and defining a exit slot for the substrate and semiconductor material, the exit slot functioning to restrict the flow of volatile materials from the conductive material deposition zone to the second chamber and from the second chamber to the conductive material deposition zone.

9. The isolation chamber of claim 8 wherein at least one supply port being positioned on the second chamber and in communication with the interior of the second chamber where the first pair of differential inserts are positioned.

10. The isolation chamber of claim 9 wherein at least one supply port being positioned on the second chamber and in communication with the interior of the second chamber where the second pair of differential inserts are positioned.

11. The isolation chamber of claim 10 wherein an inert gas source being connected to the at least one supply ports on the second chamber.

12. The isolation chamber of claim 11 wherein the source of vacuum acts to draw volatiles from the semiconductor material, the conductive material deposition zone and the inert gas from the interior of the second chamber, the first insert chamber and the second insert chamber of the isolation chamber restricting the transfer of volatile materials from the semiconductor deposition zone and the conductive material deposition zone to effectively eliminate contamination of the solar cell material during the in-line formation of the solar cell material.

13. The isolation chamber of claim 6 wherein interior of the second chamber defines a space around the first and second insert chambers, the space being at a pressure that is less than the atmospheric pressure outside of the second chamber.

14. The isolation chamber of claim 13 wherein the first and second insert chambers are at a pressure that is larger than or equivalent to the pressure in the space.

15. The isolation chamber of claim 14 wherein the first and second isolation chambers are at a pressure less 100 Torr and the space is at a pressure from about 1 m Torr to about 20 Torr.

16. A method for reducing cross contamination in the in-line production of solar cell material comprising:

advancing a substrate along an in-line solar cell production operation;

depositing a solar cell material on the substrate in a first deposition zone to form a web of the substrate and the deposited solar cell material, the first deposition zone being at a first pressure;

advancing the web to an isolation chamber, the isolation chamber having a first chamber and a second chamber;

connecting the first chamber to a source of vacuum to withdraw unreacted volatiles from the first chamber and to reduce the pressure in the first chamber;

advancing the web to the second chamber of the isolation chamber;

passing the web through at least one differential insert, the differential insert defining a slot that is having a side that is spaced from about 0.1 mm to about 5 mm from the semiconductor material, the slot restricting the unreacted volatiles from the first chamber from entering the second chamber;

connecting the second chamber to a source of vacuum to withdraw unreated volatiles from the second chamber and to reduce the pressure in the second chamber;

advancing the web from the second chamber to a second solar cell material deposition zone, the second solar cell material deposition zone being at a pressure that is less than the pressure in the second chamber of the isolation chamber.

17. The method of claim 15 in which a source of an inert gas is connected to the second chamber, the source of vacuum in the first chamber drawing the inert gas through the slot formed by the at least one differential insert into the first chamber, the source of vacuum connected to the second chamber withdrawing the inert gas from the second chamber, the flow of the inert gas acting to withdraw unreacted volatiles from the first and second chamber.

18. The method of claim 16 in which the at least one differential insert has a side made from a low friction material, the low friction material side being disposed to engage the substrate in a sliding manner and to retain the substrate in a straight orientation as it passes through the slot.

19. The method of claim 17 in which the at least one differential insert has an adjustable block that is movably mounted with respect to the low friction side, the adjustable block being moved to control the size of the slot.

20. The method of claim 18 in which the first source of vacuum, the second source of vacuum, the source of the inert gas and the position of the adjustable block are adjusted to effectively eliminate any cross contamination between adjacent solar material deposition zone by unreacted volatiles where the adjacent deposition zones are at different pressures.

* * * * *